(12) United States Patent
Bleeker et al.

(10) Patent No.: US 7,548,302 B2
(45) Date of Patent: Jun. 16, 2009

(54) LITHOGRAPHIC APPARATUS AND DEVICE MANUFACTURING METHOD

(75) Inventors: Arno Jan Bleeker, Westerhoven (NL);
Donis George Flagello, Scotttsdale, AZ (US); Robert John Socha, Campbell, CA (US); James Sherwood Greeneich, Prescott, AZ (US); Kars Zeger Troost, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/655,999

(22) Filed: Jan. 22, 2007

(65) Prior Publication Data
US 2007/0273853 A1 Nov. 29, 2007

Related U.S. Application Data

(63) Continuation-in-part of application No. 11/091,927, filed on Mar. 29, 2005, now Pat. No. 7,317,506.

(51) Int. Cl.
*G03B 27/42* (2006.01)
*G03B 27/72* (2006.01)

(52) U.S. Cl. .............................. 355/67; 355/69; 355/71

(58) Field of Classification Search ................... 355/53, 355/67, 71; 378/34, 35
See application file for complete search history.

(56) References Cited

U.S. PATENT DOCUMENTS

| | | | |
|---|---|---|---|
| 5,041,882 A | 8/1991 | Katoh | 357/16 |
| 5,115,335 A | 5/1992 | Soref | 559/248 |
| 5,178,445 A | 1/1993 | Moddel et al. | 359/85 |
| 5,229,872 A | 7/1993 | Mumola | |
| 5,296,891 A | 3/1994 | Vogt et al. | |
| 5,305,054 A | 4/1994 | Suzuki et al. | |
| 5,377,037 A | 12/1994 | Branz et al. | 359/265 |
| 5,523,193 A | 6/1996 | Nelson | |
| 5,638,211 A | 6/1997 | Shiraishi | |
| 5,668,023 A | 9/1997 | Goossen et al. | 148/33 |
| 5,673,103 A | 9/1997 | Inoue et al. | |

(Continued)

FOREIGN PATENT DOCUMENTS

EP 0 500 393 B1 11/1997

(Continued)

OTHER PUBLICATIONS

Near 0.3 k1 Full Pitch Range Contact Hole Patterning Using Chroeless Phase Lithography (CPL) by Broeke et al.; SPIE Proceedings vol. 5256 Jan. 2003.*

(Continued)

*Primary Examiner*—Della J. Rutledge
(74) *Attorney, Agent, or Firm*—Pillsbury Winthrop Shaw Pittman LLP

(57) ABSTRACT

A method of transferring an image of a pattern layout onto a surface of a substrate including selecting a first illumination profile for a first area of the pattern layout and a second illumination profile for a second area of the pattern layout; switching illumination profile during transfer of the image of the pattern layout such that the first area of the pattern layout is illuminated with the first illumination profile and the second area is illuminated with the second illumination profile; and projecting an image of the illuminated first and second areas onto the surface of the substrate.

45 Claims, 15 Drawing Sheets

U.S. PATENT DOCUMENTS

| | | | |
|---|---|---|---|
| 5,969,441 A | 10/1999 | Loopstra et al. | |
| 6,046,792 A | 4/2000 | Van Der Werf et al. | |
| 6,323,507 B1 | 11/2001 | Yokoyama et al. | 257/79 |
| 6,346,979 B1 | 2/2002 | Ausschnitt et al. | 355/53 |
| 6,413,684 B1 * | 7/2002 | Stanton | 430/5 |
| 6,429,440 B1 | 8/2002 | Bleeker | 250/492.1 |
| 6,452,662 B2 | 9/2002 | Mulkens et al. | |
| 6,466,304 B1 | 10/2002 | Smith | |
| 6,511,869 B2 | 1/2003 | Colgan et al. | 438/149 |
| 6,633,366 B2 | 10/2003 | De Jager et al. | 355/67 |
| 6,737,662 B2 | 5/2004 | Mulder et al. | 250/548 |
| 6,738,128 B2 | 5/2004 | Shima et al. | 355/52 |
| 6,741,331 B2 | 5/2004 | Boonman et al. | 355/67 |
| 6,758,608 B2 | 7/2004 | Van Arendonk et al. | 385/89 |
| 6,778,746 B2 | 8/2004 | Charlton et al. | 385/122 |
| 6,795,163 B2 | 9/2004 | Finders | 355/53 |
| 6,833,907 B2 | 12/2004 | Eurlings et al. | 355/71 |
| 6,844,927 B2 * | 1/2005 | Stokowski et al. | 356/237.1 |
| 6,847,461 B1 | 1/2005 | Latypov et al. | 356/520 |
| 6,855,486 B1 | 2/2005 | Finders et al. | 430/394 |
| 6,871,337 B2 | 3/2005 | Socha | |
| 6,887,625 B2 | 5/2005 | Baselmans et al. | |
| 7,027,130 B2 * | 4/2006 | Spence et al. | 355/69 |
| 2002/0027648 A1 | 3/2002 | Van Der Laan et al. | 355/71 |
| 2002/0180943 A1 | 12/2002 | Mulkens et al. | 355/68 |
| 2004/0222418 A1 | 11/2004 | Mochizuki | 257/59 |
| 2004/0229133 A1 | 11/2004 | Socha et al. | |
| 2004/0265707 A1 | 12/2004 | Socha | |
| 2005/0134822 A1 | 6/2005 | Socha et al. | |
| 2005/0142470 A1 | 6/2005 | Socha et al. | |
| 2006/0098181 A1 * | 5/2006 | Case et al. | 355/67 |
| 2007/0013890 A1 | 1/2007 | Loopstra et al. | 355/69 |
| 2008/0007706 A1 * | 1/2008 | Reisinger et al. | 355/67 |

FOREIGN PATENT DOCUMENTS

| | | |
|---|---|---|
| EP | 0 486 316 B1 | 4/2000 |
| EP | 0 496 891 B1 | 4/2000 |
| JP | 6-196388 A | 7/1994 |
| JP | 2001-338866 A | 12/2001 |
| JP | 2001-338886 A | 12/2001 |
| JP | 2006-135332 A | 5/2006 |
| WO | 98/33096 | 7/1998 |
| WO | 98/38597 | 9/1998 |
| WO | 98/40791 | 9/1998 |
| WO | 0077861 A | 12/2000 |

OTHER PUBLICATIONS

English translation of Japanese Official Action issued on Feb. 10, 2009 in Japanese Application No. 2006-086914.

* cited by examiner

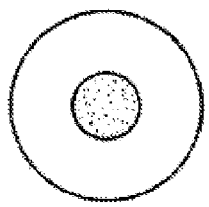 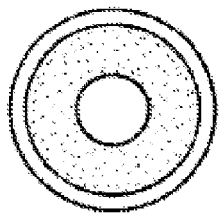 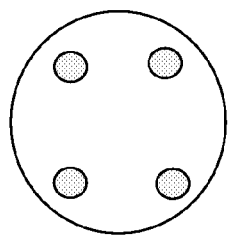 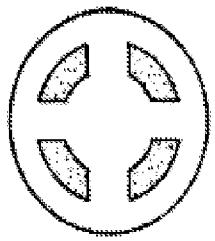
FIG. 2  FIG. 3  FIG. 4  FIG. 5
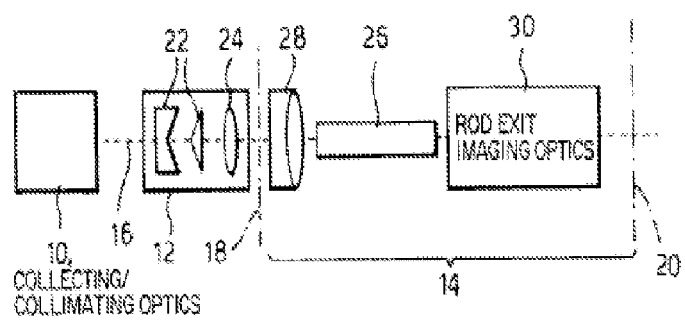
FIG. 6
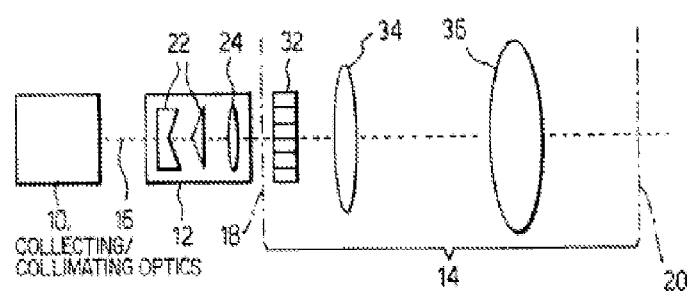
FIG. 7 ent. The term "light valve" can also be used in this context. Generally, the pattern will correspond to a particular functional layer in a device being created in the target portion, such as an integrated circuit or other device. An example of such a patterning device is a mask. The concept of a mask is well known in lithography, and it includes mask types such as binary, alternating phase shift, and attenuated phase shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

LITHOGRAPHIC APPARATUS AND DEVICE MANUFACTURING METHOD

CROSS REFERENCE TO RELATED APPLICATIONS

This application is a continuation-in-part of U.S. patent application Ser. No. 11/091,927, filed on Mar. 29, 2005, which application is incorporated herein by reference in its entirety.

BACKGROUND

1. Field

The present invention relates generally to lithographic apparatus and methods.

2. Description of the Related Art

The term "patterning device" as here employed should be broadly interpreted as referring to a device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device. An example of such a patterning device is a mask. The concept of a mask is well known in lithography, and it includes mask types such as binary, alternating phase shift, and attenuated phase shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident radiation as diffracted radiation, whereas unaddressed areas reflect incident radiation as undiffracted radiation. Using an appropriate filter, the undiffracted radiation can be filtered out of the reflected beam, leaving only the diffracted radiation behind. In this manner, the beam becomes patterned according to the addressing pattern of the matrix addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT Publication Nos. WO 98/38597 and WO 98/33096. In the case of a programmable mirror array, the support structure may be embodied as a frame or table, for example, which may be fixed or movable as required.

Another example of a patterning device is a programmable liquid crystal display (LCD) array. An example of such a construction is given in U. S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g., comprising one or more dies on a substrate (silicon wafer) that has been coated with a layer of radiation sensitive material (resist)). In general, a single wafer will contain a whole network of adjacent target portions that are successively irradiated via the projection system, one at a time. In current apparatuses, employing patterning by a mask on a mask table, a distinction can be made between two different types of machines. In one type of lithographic projection apparatus, each target portion is irradiated by exposing the entire mask pattern onto the target portion at once. Such an apparatus is commonly referred to as a wafer stepper. In an alternative apparatus, commonly referred to as a step and scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g., in a mask) is imaged onto a substrate that is at least partially covered by a layer of radiation sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement and/or inspection of the imaged features. This array of procedures is used as a basis to pattern an individual layer of a device, e.g., an IC. Such a patterned layer may then undergo various processes such as etching, ion-implantation (doping), metallization, oxidation, chemical, mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the substrate, thus defining the origin of a coordinate system on the substrate. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, for example, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing," Third Edition, by Peter van Zant, McGraw Hill Publishing Co., 1997, ISBN 0-07-067250-4.

For the sake of simplicity, the projection system may hereinafter be referred to as the "projection lens." However, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatuses are described, for example, in U.S. Pat. No. 5,969,441 and WO 98/40791.

In order to keep pace with Moore's law and develop features having sub-wavelength resolution, it has become necessary to use a variety of resolution enhancement techniques (RET). Historically, the Rayleigh criteria for resolution (R) and depth of focus (DOF) have been utilized to evaluate the performance of a given technology:

$$R = k_1 \lambda / NA$$

$$DOF = \pm k_2 \lambda / NA^2$$

where $k_1$ and $k_2$ are process dependent factors, $\lambda$ is wavelength, and NA is numerical aperture. Depth of focus is one of the factors determining the resolution of the lithographic apparatus and is defined as the distance along the optical axis over which the image of the pattern is adequately sharp.

The resolution limit of currently available lithographic techniques is being reached due to a decrease in the depth of focus, difficulty in the design of lenses and complexities in the lens fabrication technology. A lower limit on the value of the constant $k_1$ has thus far appeared to be approximately 0.25.

In order to improve resolution performance of a lithographic system, various tools may be used. In one approach, illumination systems are refined by considering alternatives to full circular illumination apertures. A system where illumination is obliquely incident on the patterning device at an angle so that the zero-th and first diffraction orders are distributed on alternative sides of the optical axis may allow for improvements. Such an approach is generally referred to as off-axis illumination. Off-axis illumination improves resolution by illuminating the patterning device with radiation that is at an angle to the optical axis of the projection system. The incidence of the radiation on the patterning device, which acts as a diffraction grating, improves the contrast of the image by transmitting more of the diffracted orders through the projection system. Off-axis illumination techniques used with conventional masks produce resolution enhancement effects similar to resolution enhancement effects obtained with phase shifting masks. Besides off-axis illumination, other currently available RET include optical proximity correction (OPC) of optical proximity errors (OPE), phase shifting masks (PSM), and sub-resolution assist features (SRAF). Each technique may be used alone, or in combination with other techniques to enhance the resolution of the lithographic projection tool.

One approach to providing oblique illumination patterns is to incorporate a metal aperture plate or spatial filter into the projection system illuminator assembly. In one example, a pattern on such a metal plate would have four symmetrically arranged openings (zones) with sizing and spacing set to allow diffraction order overlap for specific geometry sizing and duty ratio on the patterning device. This is known as quadrupole illumination. Such an approach results in a significant loss in intensity available to the patterning device, lowering throughput and making the approach less than desirable. Additionally, the four circular openings need to be designed specifically for certain patterning device geometry and pitch and do not improve the performance of other geometry sizes and spacings. The previous work in this area describes such a method using either two or four openings in the aperture plate. See, for example, EP 0 500 393, U.S. Pat. Nos. 5,305,054, 5,673,103, 5,638,211, EP 0 496 891 and EP 0 486 316.

Another approach to off-axis illumination using the four-zone configuration, which is disclosed in U.S. Pat. No. 6,452,662 incorporated herein by reference in its entirety, is to divide the illumination field into beams that can be shaped to distribute off-axis illumination to the patterning device. By incorporating the ability to shape off-axis illumination, throughput and flexibility of the exposure source is maintained. Additionally, this approach allows for illumination that combines off-axis and on-axis (conventional) characteristics. By doing so, the improvement to dense features that are targeted with off-axis illumination is less significant than straight off-axis illumination. The performance of less dense features, however, is more optimal because of the more preferred on-axis illumination for these features. The result is a reduction in the optical proximity effect between dense and isolated features. Optimization is less dependent on feature geometry and more universal illumination conditions can be selected.

Available illumination intensity distributions or arrangements include small, or low, sigma, annular, quadrupole, and QUASAR™. The annular, quadrupole and QUASAR™ illumination techniques are examples of off-axis illumination schemes.

Small sigma illumination is incident on the patterning device with approximately zero illumination angle (i.e., almost perpendicular to the patterning device) and produces good results with phase shifting patterning device to improve resolution and increase the depth of focus. Annular illumination is incident on the patterning device at angles that are circularly symmetrical and improves resolution and increases depth of focus while being less pattern dependent than other illumination schemes. Quadrupole and QUASAR™ illumination are incident on the patterning device with four main angles and provide improved resolution and increased depth of focus while being strongly pattern dependent.

FIGS. 6 and 7 show two schematic representations of an illumination system. The illumination systems include light collecting/collimating optics 10, an axicon/zoom module 12, and light integrating and projecting optics 14. The systems define an optical axis 16, a pupil plane 18, and reticle plane 20. The axicon/zoom module 12 comprises a pair of axicons 22, one concave and one convex, whose separation can be varied. The module 12 also includes a zoom lens 24. To improve the illumination homogeneity, an optical integrator 26 is used, as shown in FIG. 6. In FIG. 6, the optical integrator takes the form of a light pipe 26, such as a glass, calcium fluoride or quartz rod. A coupler 28 couples the illumination at the pupil plane 18 into the rod 26, and rod exit imaging optics 30 are also provided. Various illumination intensity distributions are achievable at the pupil plane 18 by varying the separation between the axicons. In FIG. 7 a fly's eye element 32 acts as the integrator. The fly's eye element 32 is a composite lens comprising an array or honeycomb of small lenses. Further, objective lenses 34 and 36 complete the projection optics.

For even more complex illumination patterns, a spatial filter having a number of transmissive regions may be used to create a dithered pattern as described in U.S. Pat. No. 6,466,304, for example. The filter of that patent, includes a translucent substrate and a masking film. The distribution of the intensity through the masking aperture in the illumination pupil plane is preconfigured to provide optimized illumination for a particular patterning device pattern to be imaged. The dithering allows the illumination region or regions to exhibit varying intensity, as a result of the half-tone pattern created by the pixelation of the masking film. This can allow a variation in illumination intensity beyond the simple binary (clear or opaque) possible with other pupil plane filtering approaches.

Photolithographic simulations may be used to aid in the development, optimization and use of lithographic apparatuses. They can be extremely helpful as a development tool, by quickly evaluating options, optimizing processes, and saving time and money by reducing the number of required experiments. Simulations can also be helpful in the research context for understanding many physical phenomena that occur when pushing the limits of resolution to achieve feature size in the order of or below the wavelength of the lithographic apparatus.

SUMMARY

In an embodiment of the present invention, there is provided a lithographic apparatus including an illumination system configured to condition a radiation beam, a support constructed to support a patterning device, the patterning device being capable of imparting the radiation beam with a pattern in its cross-section to form a patterned radiation beam, a substrate table constructed to hold a substrate, a projection system configured to project the patterned radiation beam onto a target portion of the substrate and a variable optical element forming a part of the illumination system and comprising an array of addressable elements, each addressable element constructed and arranged to have a variable transmittance.

In another embodiment of the present invention, there is provided a method of imaging using a lithographic apparatus including producing a beam of radiation, varying the transmittance of a plurality of addressable elements of a variable optical element, impinging the beam of radiation on to the variable optical element thereby patterning the beam of radiation according to a desired illumination pattern, illuminating an image patterning device with the beam of radiation and projecting the beam of radiation onto a substrate.

In yet another embodiment of the invention, there is provided a method of transferring an image of a pattern layout onto a surface of a substrate including selecting a first illumination profile for a first area of the pattern layout and a second illumination profile for a second area of the pattern layout; switching illumination profile during transfer of the image of the pattern layout such that the first area of the pattern layout is illuminated with the first illumination profile and the second area is illuminated with the second illumination profile; and projecting an image of the illuminated first and second areas onto the surface of the substrate.

In an embodiment of the invention, there is provided a lithographic apparatus including a programmable illuminator configured to provide an illumination profile; a support configured to hold a patterning device, the patterning device configured to provide a pattern illuminated by the illumination profile; a substrate table configured to hold a substrate; a projection system configured to project an image of the patterning device onto the substrate; and a controller configured to switch the illumination profile from a first illumination profile to a second illumination profile during transfer of the image of the patterning device onto the substrate such that a first area of the patterning device is illuminated with the first illumination profile and a second area of the patterning device is illuminated with the second illumination profile.

In another embodiment of the invention, there is provided a method for transferring an image of a pattern layout onto a substrate, the pattern layout including a plurality of fields generated by a programmable patterning device, the method including configuring an illumination profile for each field of the pattern layout, the illumination profile provided by a programmable illuminator; controlling the programmable illuminator and the programmable patterning during transfer of the image of the pattern layout onto the substrate such that each field of the pattern layout is illuminated with its associated configured illumination profile; and projecting an image of each field of the pattern layout onto the substrate to form the image of the pattern layout.

In yet another embodiment of the invention, there is provided a method for transferring an image of a pattern layout onto a substrate, the pattern layout including a plurality of fields generated by a programmable patterning device, the method including selecting one of the fields of the pattern layout; configuring an illumination profile and the programmable patterning device for the selected field of the pattern layout, the illumination profile provided by a programmable illuminator; configuring the programmable patterning device for the remaining fields of the pattern layout using the illumination profile configured for the selected field; controlling the programmable illuminator and the programmable patterning during transfer of the image of the pattern layout onto the substrate such that each field of the pattern layout is generated with its associated patterning device configuration and illuminated with the illumination profile configured for the selected field.

In an embodiment of the invention, there is provided a computer product having machine executable instructions, the instructions being executable by a machine to perform a method for transferring an image of a pattern layout onto a substrate, the pattern layout including a plurality of fields generated by a programmable patterning device. The method includes configuring an illumination profile for each field of the pattern layout, the illumination profile provided by a programmable illuminator; controlling the programmable illuminator and the programmable patterning device during transfer of the image of the pattern layout onto the substrate such that each field of the pattern layout is illuminated with its associated configured illumination profile; and projecting an image of each field of the pattern layout onto the substrate to form the image of the pattern layout.

In an embodiment of the invention, there is provided a computer product having machine executable instructions, the instructions being executable by a machine to perform a method for transferring an image of a pattern layout onto a substrate, the pattern layout including a plurality of fields generated by a programmable patterning device. The method includes selecting one of the fields of the pattern layout; configuring an illumination profile for the selected field of the pattern layout, the illumination profile provided by a programmable illuminator; configuring the programmable patterning device for each of the fields of the pattern layout using the illumination profile configured for the selected field; and controlling the programmable illuminator and the programmable patterning device during transfer of the image of the pattern layout onto the substrate such that each field of the pattern layout is generated with its associated patterning device configuration and illuminated with the illumination profile configured for the selected field.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. It should be appreciated that, in the context of such alternative applications, any use of the terms "reticle," "wafer" or "die" in this text should be considered as being replaced by the more general terms "patterning device," "substrate" and "target portion," respectively.

In the present document, the terms "radiation" and "beam" are used to encompass all types of electromagnetic radiation, including ultraviolet radiation (e.g., with a wavelength of 365, 248, 193, 157 or 126 nm) and EUV (extreme ultra-violet radiation, e.g., having a wavelength in the range 5-20 nm), as well as particle beams, such as ion beams or electron beams.

BRIEF DESCRIPTION OF THE DRAWINGS

Embodiments of the invention will now be described, by way of example only, with reference to the accompanying schematic drawings in which:

FIG. 2 is a schematic illustration of a small, or low, sigma illumination arrangement;

FIG. 3 is a schematic illustration of an annular off-axis illumination arrangement;

FIG. 4 is a schematic illustration of an off-axis quadrupole illumination arrangement;

FIG. 5 is a schematic illustration of an off-axis QUASAR™ illumination arrangement;

FIG. 6 is a schematic illustration of a known illumination system;

FIG. 7 is a schematic illustration of another known illumination system;

DETAILED DESCRIPTION

Figure 1:
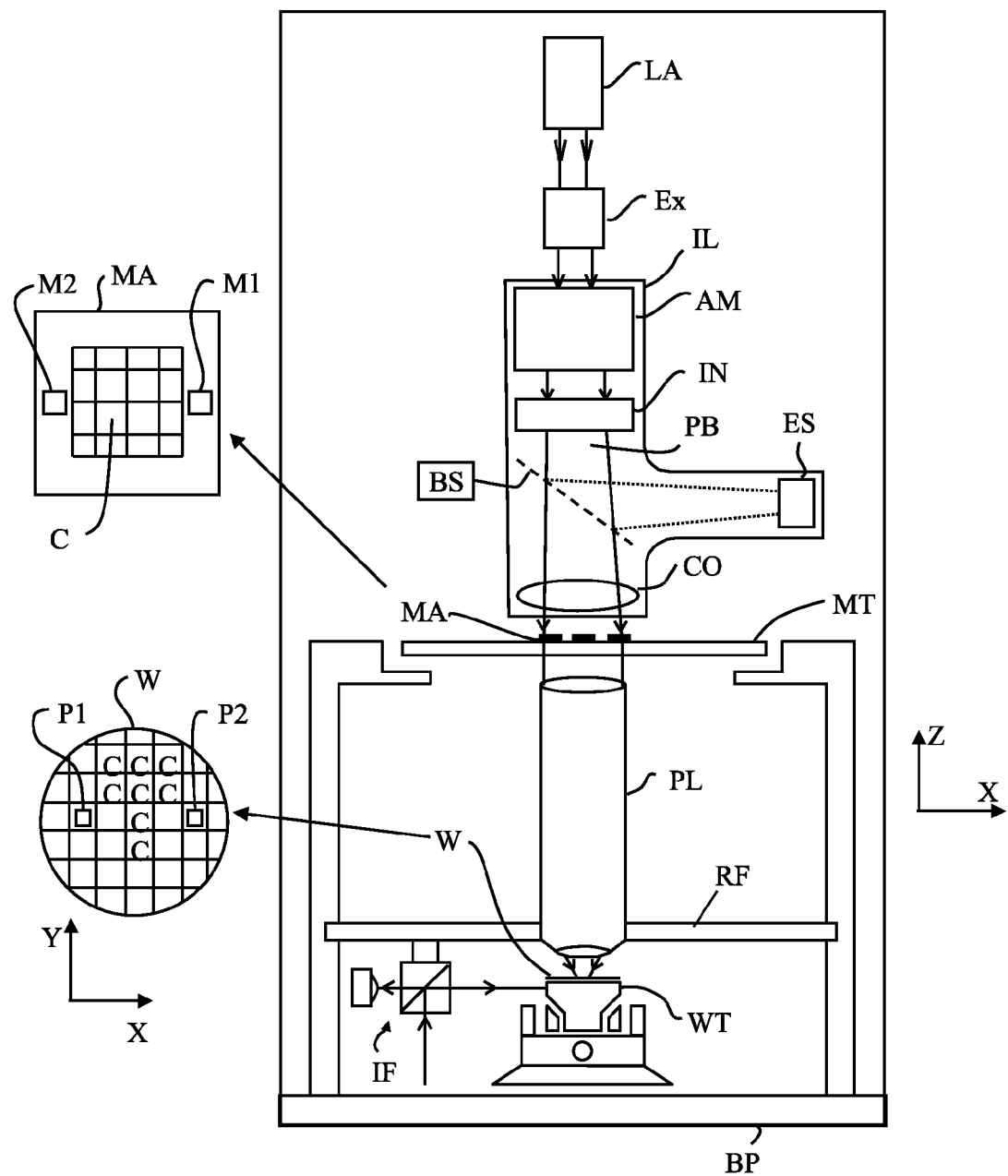
FIG. 1 is a schematic illustration of a photolithographic apparatus in accordance with an embodiment of the invention.
Figure 8:
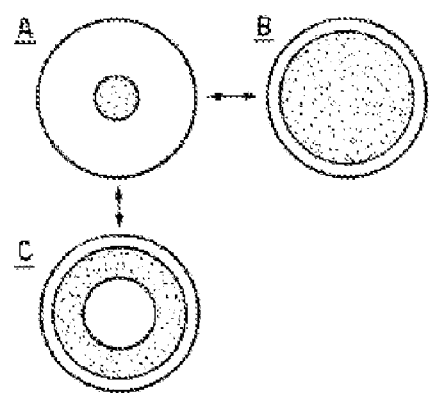
FIG. 8 is a schematic illustration of illumination arrangements obtainable with the illumination systems of FIGS. 6 and 7.

FIG. 1 schematically depicts a lithographic projection apparatus 1 according to an embodiment of the invention. The apparatus includes a radiation system Ex, IL constructed and arranged to supply a beam PB of radiation (e.g., UV or EUV radiation, such as, for example, generated by an excimer laser operating at a wavelength of 248 nm, 193 nm or 157 nm, or by a laser-fired plasma source operating at 13.6 nm). The apparatus includes a base plate BP. In this embodiment, the radiation system also includes a radiation source LA. The apparatus also includes a first object (patterning device) table MT provided with a holder constructed and arranged to hold a patterning device such as a mask MA, and connected to a first positioning device PM to accurately position the mask MA with respect to a projection system or lens PL; a second object (substrate) table WT provided with a substrate holder constructed and arranged to hold a substrate W (e.g., a resist-coated silicon wafer), and connected to a second positioning device PW to accurately position the substrate with respect to the projection system or lens PL. The projection system or lens PL (e.g., a quartz and/or $CaF_2$ lens system or a refractive or catadioptric system, a mirror group or an array of field deflectors) is constructed and arranged to image an irradiated portion of the mask MA onto a target portion C (e.g., comprising one or more dies) of the substrate W. The projection system PL is supported on a reference frame RF.

As here depicted, the apparatus is of a transmissive type (i.e., has a transmissive mask). However, in general, it may also be of a reflective type, (e.g., with a reflective mask). Alternatively, the apparatus may employ another kind of patterning device than mask MA, such as a programmable mirror array of a type as referred to above.

The source LA (e.g., a UV excimer laser, an undulator or wiggler provided around the path of an electron beam in a storage ring or synchrotron, a laser-produced plasma source, a discharge source or an electron or ion beam source) produces a beam PB of radiation. The beam PB is fed into an illumination system (illuminator) IL, either directly or after having traversed a conditioner, such as a beam expander Ex, for example. The illuminator IL may include an adjusting device AM for setting the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g., with the aid of suitable directing mirrors). The latter scenario is often the case when the source LA is an excimer laser. Embodiments of the present invention encompasses both of these scenarios. In particular, the present invention encompasses embodiments wherein the radiation system Ex, IL is adapted to supply a projection beam of radiation having a wavelength of less than about 250 nm, such as with wavelengths of 248 nm, 193 nm, 157 nm, 126 nm and 13.6 nm, for example.

The beam PB subsequently intercepts the mask MA, which is held on the mask table MT. Having traversed the mask MA, the beam PB passes through the projection system PL, which focuses the beam PB onto a target portion C of the substrate W. With the aid of the second positioning device PW and interferometer IF, the substrate table WT can be moved accurately, e.g., so as to position different target portions C in the path of the beam PB. Similarly, the first positioning device PM can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the patterning device table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the patterning device table MT is kept essentially stationary, and an entire mask image is projected at once, i.e., a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the patterning device table MT is movable in a given direction (the so-called "scan direction," e.g., the Y direction) with a speed v, so that the beam PB is caused to scan over a mask image. Concurrently, the substrate table WT is simultaneously moved in the same or opposite direction at a speed V=Mv, in which M is the magnification of the projection system PL (typically, M=¼ or ⅕). In this manner, a relatively large target portion C can be exposed, without having to compromise on resolution.

In the illumination system IL, a part of the beam PB is diverted to an energy sensor ES by a beam splitter BS. Beam splitter BS may be a reflector formed by depositing aluminum on quartz and used to fold the beam PB to a convenient orientation. A pattern of small holes is etched into the aluminum layer to let a known proportion, e.g., 1%, through to the energy sensor. The output of the energy sensor is used in controlling the dose delivered in an exposure.

As noted above, during imaging, it may be beneficial to select a particular illumination pattern in order to improve imaging. Contrast for certain regularly aligned features, for example may be improved by making use of multipole illumination such as dipole illumination and the two quadrupole illuminations shown in FIGS. 4 and 5.

Figure 9:
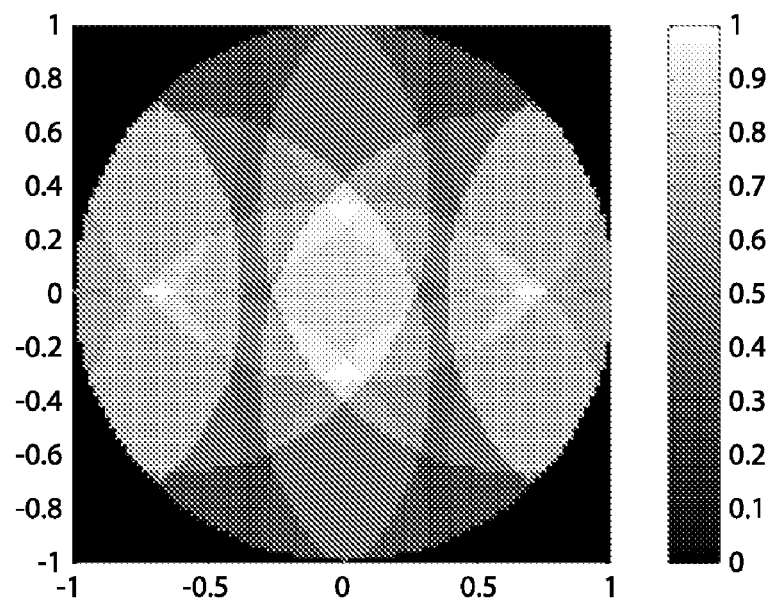
FIG. 9 is a schematic illustration of a complex illumination pattern such as may be produced in accordance with an embodiment of the present invention.

FIGS. 4 and 5 each illustrate quadrupole illuminations in which the radiation poles are located in each quadrant of the illumination pattern with centers 45° from the orthogonal lines. This orientation can produce optimal projection of the lines, particularly for dense structures, such as for DRAM-like structures. The orthogonal lines are generally referred to as horizontal and vertical. As pattern features decrease in size, poles located in each quadrant with centers 90° from the orthogonal lines become more preferred. The optimal sigma for quadrupole illumination can be estimated from the formula: $\sigma=\lambda/(\sqrt{2}NA\cdot pitch)$, and for dipole and 45° rotated quadrupole from: $\sigma=\lambda/(2NA\cdot pitch)$ More generally, in a typical application, it is possible to calculate an optimized illumination profile for a given patterning device pattern. For example, the geometric and optical parameters of the lithographic apparatus may be defined and loaded in a lithography simulation software, such as Prolith™ or Solid-C™. Specifically, the characteristics of the illumination system and the illumination conditions may be defined. After running simulations, either single or iterative, a selected optimal profile may be determined. In many cases, the optimal profile for a given patterning device pattern will not correspond in a simple fashion to one of the types that is available using the zoom axicon arrangement described above in FIGS. 5-6 and a metal plate aperture, or a spatial filter having a number of transmissive regions would normally be used. For example, as shown in FIG. 9, it may be useful to have a quite detailed illumination pattern having a number of bright spots, a number of dark spots and several regions that are somewhere in between.

Figure 10:
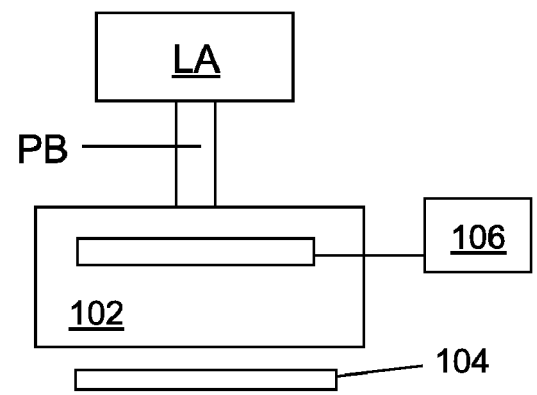
FIG. 10 is a schematic illustration of an illuminator including a variable optical element in accordance with an embodiment of the present invention.
Figure 11:
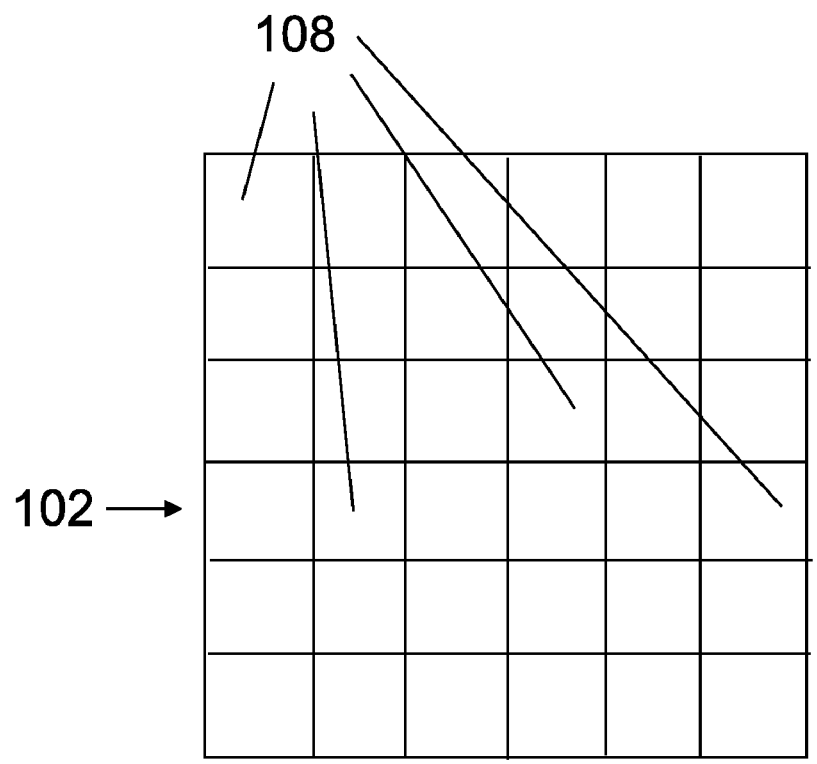
FIG. 11 is a schematic illustration of an array of addressable elements forming a variable optical element in accordance with an embodiment of the present invention.

In this case, an illumination system IL according to an embodiment of the present invention, as shown schematically in FIG. 10 may be employed to produce the optimized profile. As described above, a beam of radiation PB enters the illumination system IL from the source LA. A variable optical element, 102, positioned in the beam, transmits the radiation to a collector 104. A controller, 106 is operationally connected to the variable optical element 102 and provides, for example, electrical control signals that operate to modify the transmissivity of an array of sub-elements 108 as illustrated in FIG. 11.

In certain embodiments, the array may be an array of square or hexagonal elements, producing a fully packed planar area. This is not strictly necessary, however. Even though an array that is not closely packed would contain small dark portions in the illumination plane, these should not adversely affect imaging as the use of a uniformer or integrator IN as described above in relation to FIG. 1 will tend to eliminate the non-uniformities. The arrays may be made up of varying numbers of elements.

In embodiments of the present invention, the variable optical element 106 is a liquid crystal display (LCD) made up of an array of picture elements (pixels) that are controllable and addressable via electronic signals from, for example, controller 106. The pixels may be individually addressable, or may be addressable in groups, to create larger pixel sizes. When activated, the pixels can be changed from light (highly transmissive) to dark (substantially opaque). Though these two states can be considered to be on and off, in practice, they will rarely correspond to 100% and 0% transmission due to the material constraints of the LCD array.

Furthermore, it can be useful to make use of an LCD that is capable of several intermediate states in addition to the on and off states in order to allow for a grey scale illumination. For example, each picture element may be capable of 4, 8, 16, 32, 64 or even more different levels of radiation transmission.

In an alternate arrangement, the variable optical element 102 may be made up of an array of heterojunction regions. Each heterojunction region may be individually addressable, or the regions may be grouped into larger picture elements.

Each heterojunction region has a characteristic band gap and an inherent transmittance for the wavelength or range of wavelengths used for imaging in the lithographic apparatus. In this embodiment, the controller 106 applies a voltage to the heterojunctions in order to vary the band gap. By varying the voltage applied to the junction, either by changing the magnitude or by reversing the voltage, the band gap is altered, thereby altering the optical density of the heterojunction material. A change in the optical density corresponds to a change in transmissivity, thereby providing for a variable illumination field. In particular, optical density can be expressed as $\log_{10}(1/T)$, where T is the transmittance of the material. Thus, the higher the optical density, the lower the transmittance. Examples of heterojunction materials that may find use in an embodiment of the present invention include Si and SiGe materials usually along with appropriate doping constituents.

As with the LCD embodiment, the heterojunction embodiment may be used in an application in which each pixel is in either an on or an off state (substantially 100% or substantially 0% transmission respectively) or in an application in which the pixel varies between an on and an off state.

In the case that the elements of the variable optical element are picture elements (pixels) of a LCD, such arrays are commercially available with up to one thousand or more elements per side. However, such a high number of elements is not required for useful results. Arrays of 32×32 or 128×128 can provide a sufficient degree of variability in illumination pupils produced. Furthermore, a smaller array becomes simpler to control. Likewise, numerical modeling of the illumination pattern is performed more easily for relatively small arrays.

Figure 12:
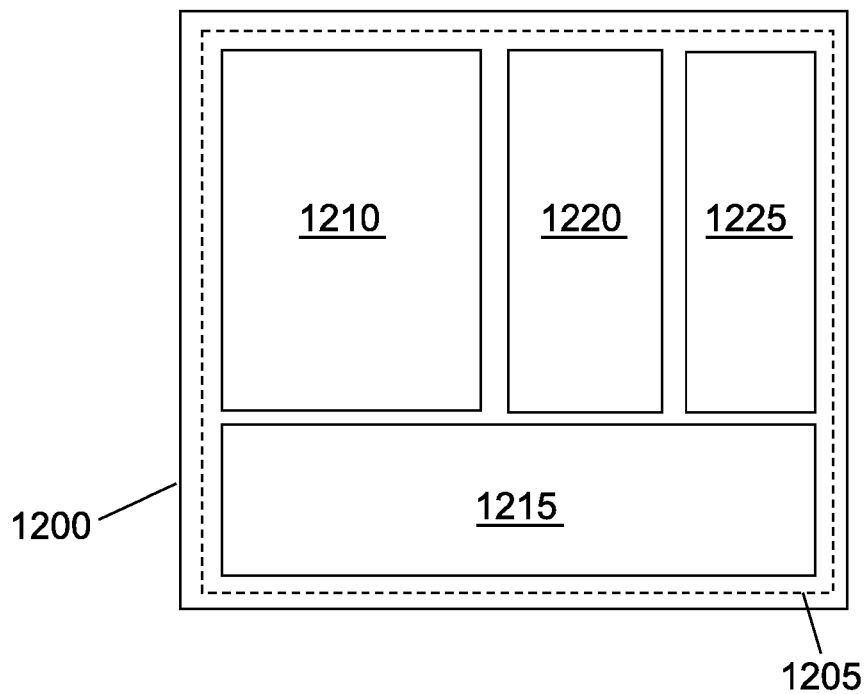
FIG. 12 is a schematic representation of a system-on-a-chip.

A system-on-a-chip (SOC) device is designed to integrate different electronic components having different functionalities into a single chip. SOC devices may include digital, analog, mixed-signal and radio-frequency functions. For example, referring to FIG. 12, this figure shows a schematic representation of a die 1200 including a SOC 1205. SOC 1205 may be, for example, a sound detecting device. Generally, SOC 1205 may include a memory block 1210, a processor block 1215, an analog-to-digital converter block 1220 and an input/output logic control block 1225. Different and/or additional blocks may be used in other SOCs in other implementations. Further, a plurality of blocks may be combined into a block, i.e., a composite block of blocks.

As will be appreciated by one of ordinary skill in the art, the design rules and density of patterns, i.e., contacts and/or trenches and/or lines, of these blocks may not be the same. As a result, the optimum imaging conditions of blocks 1210, 1215, 1220 and 1225 in SOC 1205 may not be identical. One option to produce SOC devices and, more generally, electronic devices including blocks with different density of patterns, is to select a single, less aggressive, illumination mode to print all blocks on the die. However, this option is generally undesirable as the process window associated with the selected illumination mode can be drastically reduced for certain blocks. Furthermore, in many cases, the selected illumination mode is simply unable to adequately image certain blocks.

Thus, in order to correctly resolve the patterns in each block of an electronic device having multiple blocks of functionality and to maximize the process window of the exposure process, it is proposed in one embodiment of the invention to change the illumination conditions during imaging such that each block is printed with its own optimum or desired illumination conditions.

Figure 13:
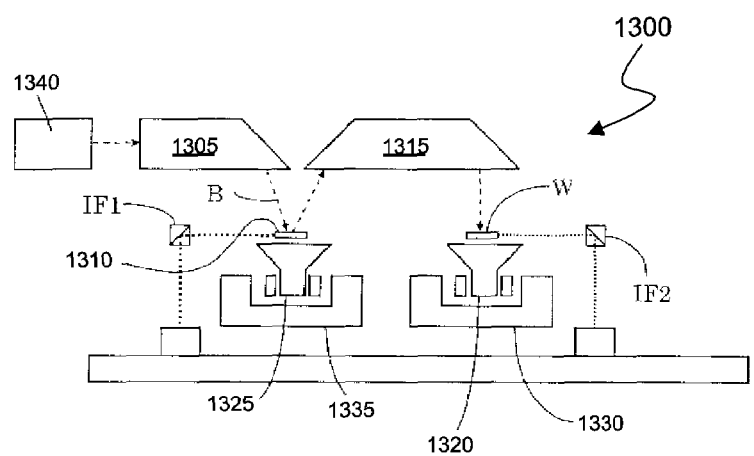
FIG. 13 is a schematic illustration of a lithographic apparatus in accordance with an embodiment of the invention.

Referring to FIG. 13, this figure shows a lithographic apparatus 1300 in accordance with an embodiment of the invention. Lithographic apparatus 1300 is adapted to change the illumination conditions during imaging of blocks 1210, 1215, 1220 and 1225 such that each block is printed with its own illumination conditions. Lithographic apparatus 1300 generally includes a programmable illuminator 1305, a patterning device 1310, a projection system 1315 and a substrate table 1320. The programmable illuminator 1305 may be referred to hereinafter as a programmable source. Similarly to FIG. 1, a support 1325 is adapted to support the patterning device 1310. With the aid of a positioner 1330 and position sensor IF2 (e.g., an interferometric device, linear encoder or capacitive sensor), the substrate table 1320 can be moved accurately, e.g., so as to position different target portions of the substrate W in the path of the radiation beam B. Similarly, a positioner 1335 and another position sensor IF1 can be used to accurately position the patterning device 1310 with respect to the path of the radiation beam B. Movement of the support 1325 may be realized with the aid of a long-stroke module (coarse positioning) and a short-stroke module (fine positioning), which form part of the positioner 1335. Similarly, movement of the substrate table 1320 may be realized using a long-stroke module and a short-stroke module, which form part of the positioner 1330.

As depicted here, the apparatus is of a reflective type (e.g., employing a reflective patterning device). In the embodiment of FIG. 13, the patterning device 1310 is preferably a programmable patterning device such as, for example, a programmable mirror array or a spatial light modulator. For example, the array or modulator may be a matrix-addressable surface having a viscoelastic control layer and a reflective surface. Alternatively, the programmable mirror array may employ a matrix arrangement of tiny mirrors, each of which can be individually tilted about an axis by applying a suitable localized electric field, or by employing piezoelectric actuators. The mirrors are matrix addressable, such that addressed mirrors will reflect an incoming radiation beam in a different direction than unaddressed mirrors. In this manner, the reflected beam is patterned according to the addressing pattern of the matrix-addressable mirrors. It will be appreciated that other types of programmable patterning devices may be used in other embodiments of the invention.

As shown in FIG. 13, the programmable illuminator 1305 receives a radiation beam B from a radiation source 1340. The radiation source 1340 and the lithographic apparatus 1300 may be separate entities, for example when the source is an excimer laser. In such cases, the source is not considered to form part of the lithographic apparatus and the radiation beam is passed from the source 1340 to the programmable illuminator 1305 with the aid of a beam delivery system including, for example, suitable directing mirrors and/or a beam expander. In other cases the source 1340 may be an integral part of the lithographic apparatus, for example when the source is a mercury lamp.

The radiation beam B is incident on the patterning device 1310, which is held by the support 1325, and is patterned by the patterning device 1310. After being reflected by the patterning device 1310, the radiation beam B passes through the projection system 1315, which focuses the beam onto a target portion of the substrate W.

Figure 14:
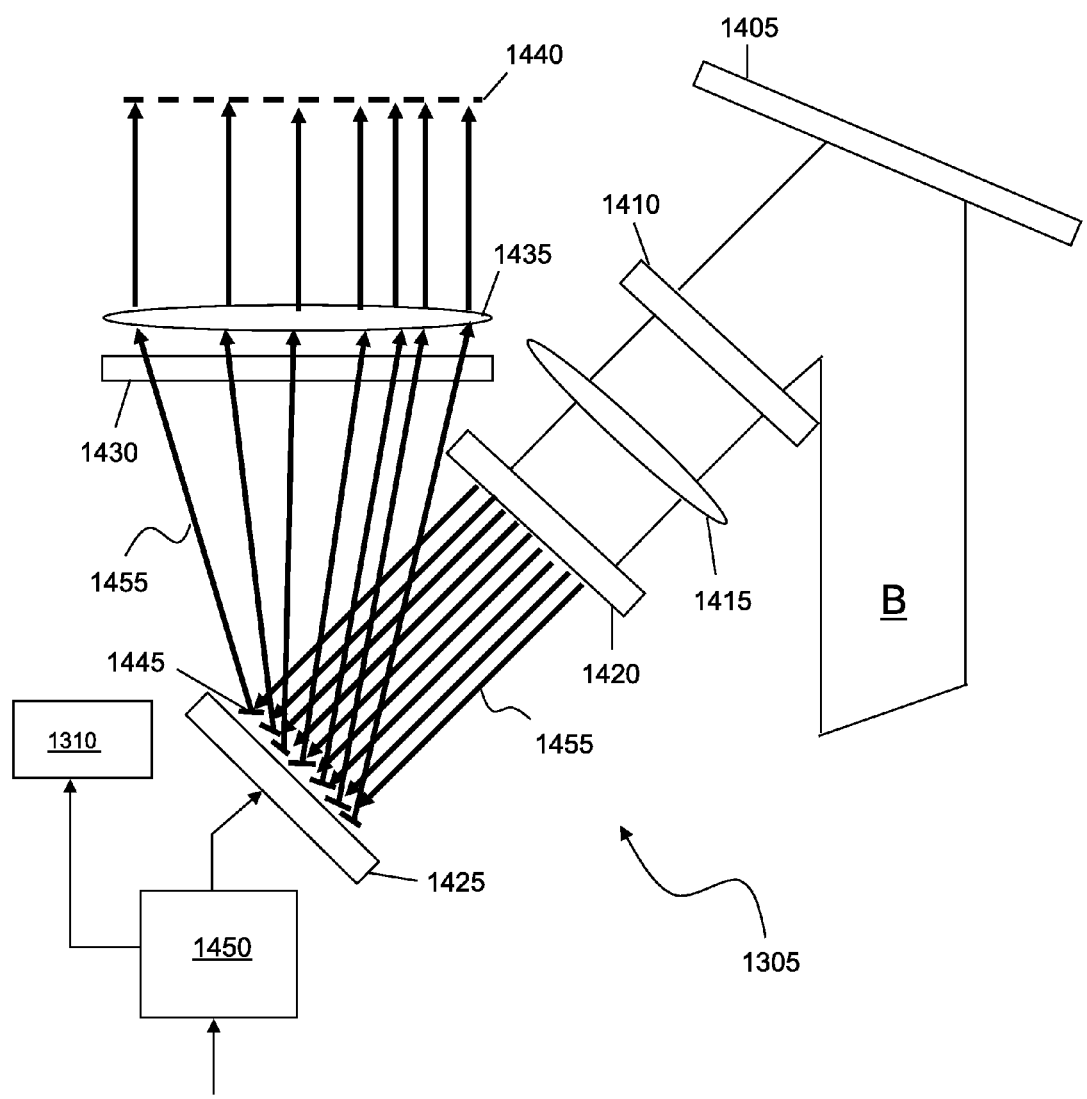
FIG. 14 is a schematic illustration of a programmable illuminator in accordance with an embodiment of the invention.

Referring now to FIG. 14, this figure shows the programmable illuminator 1305 in accordance with an embodiment of the invention. The illuminator 1305 includes a mirror 1405, an optical element 1410, a first lens 1415, a micro lens array 1420, a micro mirror array 1425, a diffuser 1430 and a second lens 1435. The micro mirror array 1425 includes a plurality of mirrors 1445 that are independently controllable by a controller 1450.

As shown in FIG. 14, a radiation beam B received by the illuminator 1305 is reflected by the first mirror 1405 and directed toward the optical element 1410, the first lens 1415 and the micro lens array 1420. The optical element 1410 is a ROE 2 like element. A ROE 2 like element is a diffractive or refractive element that is configured to add an angular distribution to the impinging radiation. In FIG. 14, the optical element 1410 is configured to translate the angular distribution into a correctly shaped and uniform intensity distribution on the microlens array 1420. This element is adapted to reduce the position variations of the radiation beam B induced by the laser source 1340 that are in the same order of magnitude as the size of mirrors 1445. The micro lens array 1420 is illuminated by the pupil of the ROE 2 like element using the first lens 1415. The micro lens array 1420 includes a plurality of lenses (not shown in FIG. 14) that are each adapted to illuminate one micro mirror 1445 of the micro mirror array 1425.

Figure 15:
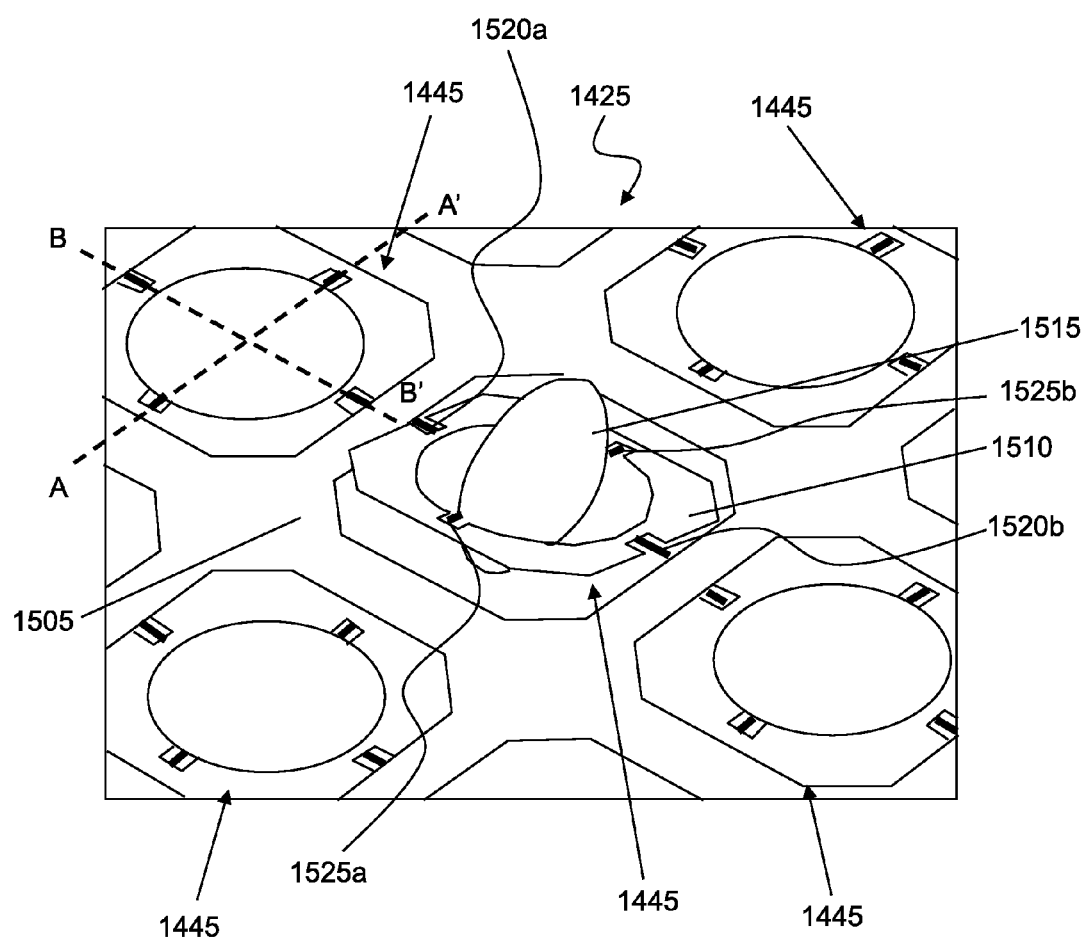
FIG. 15 is a schematic illustration of a micro mirror array in accordance with an embodiment of the invention.

FIG. 15 shows the micro mirror array 1425 in accordance with an embodiment of the invention. Each mirror 1445 of the micro mirror array 1425 is rotatable about two axes of rotation (identified as AA' and BB' in FIG. 15). Each mirror 1445 includes a base portion 1505, a rotatable peripheral portion 1510 and a reflective portion 1515. The rotatable peripheral portion 1510 is rotatably attached to the base portion 1505 with rotating members 1520*a-b*. Similarly, the reflective portion 1515 is rotatably attached to the rotatable peripheral portion 1510 with rotating members 1525*a-b*. In one embodiment, the reflective portion 1515 is made of a thick single crystal silicon that is gold coated to ensure high reflectivity.

Rotation of the reflective portion 1515 and the rotatable peripheral portion 1510, and thus control of each mirror 1445, may be done with electrical capacitors (not shown in FIG. 15) that are positioned within the base portion 1505 and the rotatable peripheral portion 1510. Charge and discharge of the electrical capacitors allows the reflective portion 1515 to be positioned at a wide range of angles. It is desirable to accurately control the position of each mirror 1445. An angular error of a mirror 1445 generally results in a reflected radiation beam at a wrong position in the pupil plane 1440, which may cause unintended imaging effects. For example, in one embodiment, the rotatable peripheral portion 1510 and the reflective portion 1515 may be rotated in a range from about ±5 degrees with an angle stability and accuracy of about 0.01 degree. In another embodiment, the rotatable peripheral portion 1510 and the reflective portion 1515 may be rotated in a range from about ±20 degrees.

In one implementation, the micro mirror array 1425 has a size of about 35 mm*35 mm and includes about 500 mirrors. The diameter of each reflective portion 1515 may be between 1 and 1.5 mm. It will be appreciated that the micro mirror array 1425 may include fewer or additional mirrors in other embodiments of the invention. For example, in one implementation, the micro mirror array includes an array of 36*36 mirrors (1296 mirrors). The size of the reflective portion 1515 may also vary in other embodiments.

Referring back to FIG. 14, the micro lens array 1420 is adapted to separate the radiation beam B into a plurality of sub-beams 1455. Each sub-beam 1455 is focused onto one of the mirrors 1445 (e.g., one of the reflective portions 1515) of mirror array 1425. The mirrors 1445 then reflect the sub-beams 1455 toward the diffuser 1430. The diffuser 1430 is adapted to determine the size of each mirror spot in the pupil plane 1440. After being transmitted through the diffuser 1430, the sub-beams 1455 are then focused onto the pupil plane 1440 of the illuminator with the second lens 1435. The second lens 1435 is configured to transform the angles produced by the micro mirror array 1425 into the pupil plane 1440.

The angular position of each of the mirrors 1445 is controlled by controller 1450. The controller 1450 is adapted to, for example, individually control the actuation of the rotating members 1520*a-b* and 1525*a-b* to rotate reflective portion 1515 of mirrors 1445. By individually controlling the angular position of each reflective portion 1515, any desired illumination source shape in the pupil plane 1440 may be produced.

The mirrors 1445 may moved in any suitable manner. For example, instead of the mirrors being rotatable, they may be movable in a direction perpendicular to the substrate 1425 (e.g. moveable in the manner of pistons). Where this is done, instead of rotating the mirrors 1445 to a configuration which provides a desired illumination source shape in the pupil plane 1440, the mirrors are translated away and/or towards the substrate 1425 to a configuration which provides the desired illumination source shape in the pupil plane. The mirrors may for example be mounted on piezo-electric actuators.

Figure 16A:
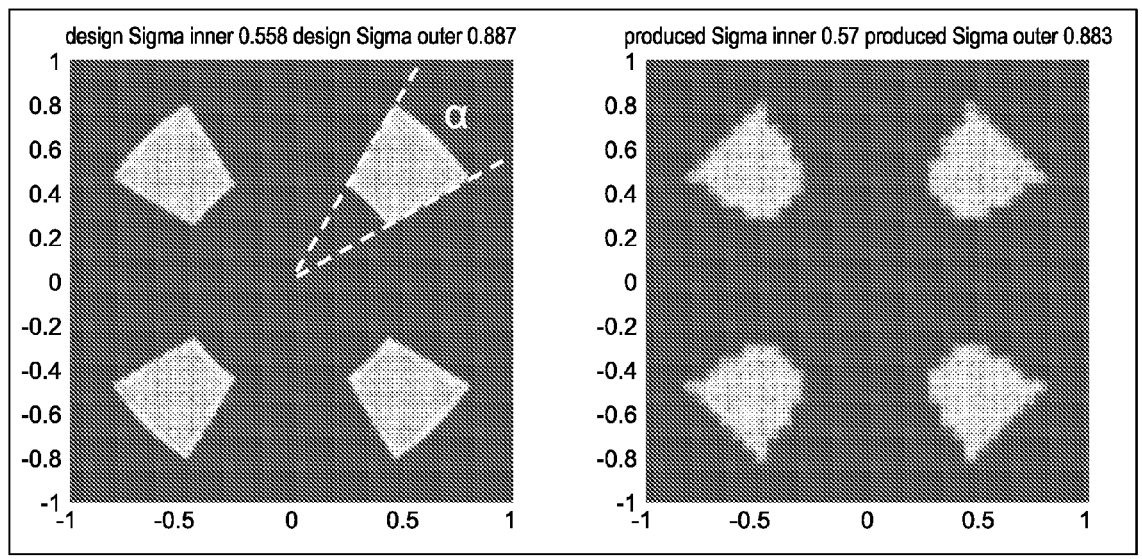
FIGS. 16a-b are schematic illustrations of two illumination shapes that can be generated with the illuminator of FIG. 14.
Figure 16B:
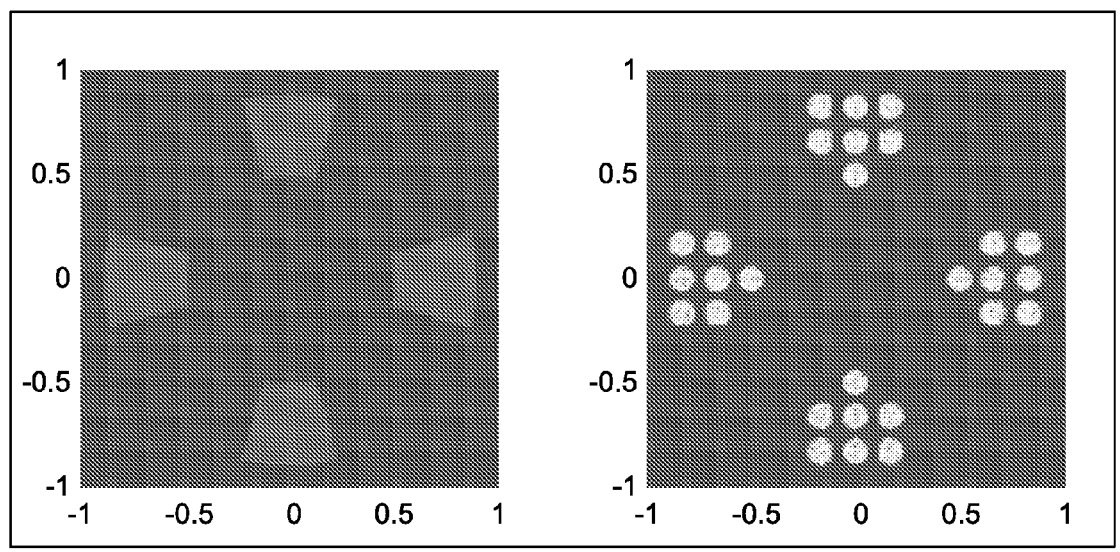

FIGS. 16*a-b* represent two illumination shapes that can be generated with the programmable illuminator 1305 of FIG. 14. The desired illumination profile (left graph of the figure) and the actual profile (right graph) are represented in both cases. FIG. 16*a* shows a quadrupole illumination produced with a micro mirror array including about 225 mirrors. The quadrupole illumination defines four substantially identical poles having a normalized inner radius ($\sigma_{in}$=0.57), a normalized outer radius ($\sigma_{out}$=0.89) and an opening angle α. FIG. 16*b* shows a quadrupole illumination created with a micro mirror array including 28 mirrors. In FIGS. 16*a-b*, each mirror 1445 represents one point in the pupil plane 1440. It is desirable that the intensity of the poles in FIGS. 16*a-b* be the same. Control of the micro mirror array 1425 may be such that specific mirrors within the micro mirror array 1425 are tilted to generate one of the poles. For example, the mirrors 1445 located in one area of the micro mirror array 1425 may be dedicated to produce one pole, while mirrors 1445 located in another area of the micro mirror array 1425 may be dedicated to produce another pole. Alternatively, each pole or illumination shape may be generated with random mirrors or mirrors over various parts of the mirror array. This latter configuration may be desirable to produce a more uniform illumination profile in the pupil plane 1440 because any non-uniformity profile present on the micro mirror array 1425 may not be transferred to the pupil plane 1440.

During imaging, the controller 1450 is in communication with both the programmable patterning device 1310 and the micro mirror array 1425. In that way, the illumination shape produced in the pupil plane 1440 may be changed in synchronization with the image field produced by the programmable patterning device 1310. For example, in optical maskless lithography, the image field produced by the programmable patterning device 1310 is about 0.1 mm*1 mm, which is generally much smaller than the die created on the substrate W. Accordingly, during imaging, each die is exposed with many patches of imaging fields. Thus, switching the illumination mode in combination with optical maskless lithography is feasible.

Referring back to FIG. 12, the die 1200 is generally exposed with numerous imaging fields. During exposure of the die 1200, the controller 1450 is adapted to control the micro mirror array 1425 so that a first illumination mode, for example, a first off axis illumination mode, is provided during printing of the memory block 1210. The first illumination mode is selected, for example, to optimize the printing of memory block 1210. During imaging of the processor block 1215, the controller 1450 may be adapted to actuate the mirrors 1445 so as to create a second different illumination mode, for example, a second off axis illumination. Similarly, the second illumination mode may be selected to optimize the printing of processor block 1215. A similar approach may be pursued to expose the remaining blocks 1220 and 1225 of the SOC 1205. By switching illumination mode during imaging of the die 1220, it is possible to print each block with its own printing condition.

It will be appreciated that the illumination mode during exposure of a particular block may also be changed. For example, if a block is imaged with more than one imaging field, it is possible to switch the illumination mode during printing of the block. This implementation may be desirable when the pattern density within one block significantly changes.

The actuation rate of the mirrors 1445 of the micro mirror array 1425 may be in a range from about 50 Hz to 12 kHz. However, it will be appreciated that the actuation rate of the mirrors may be greater than 12 kHz. In one implementation, the actuation rate of the mirrors 1445 may be in the same order of magnitude as that of the programmable patterning device 1310. (e.g., mirror array or LCD array). Alternatively, if the actuation rate of the mirrors 1445 differs from the rate at which the imaging fields are exposed on the die, it may be desirable to orient the various blocks within a die such that non-critical blocks are positioned between adjacent critical blocks. Non critical blocks are regions within the die that are not sensitive to the illumination mode. Non critical blocks are exposed with a hybrid illumination that is produced when the micro mirror array 1425 switches illumination mode. For example, in FIG. 12, the region of the die 1200 located between the memory block 1210 and the processor block 1215 may be exposed with a hybrid illumination that is generated when the controller 1450 switches from the first illumination mode to the second illumination mode.

Configuration of the various illumination modes may be done by lithographic simulations. Simulations can be used to determine the optimal illumination conditions that are desirable to print various areas or blocks of each die. Once the illumination conditions are known, this information is inputted to the controller 1450 to control the micro mirror array 1425 during imaging. More generally, exposure of each die may be done in accordance with the method of FIG. 17.

Figure 17:
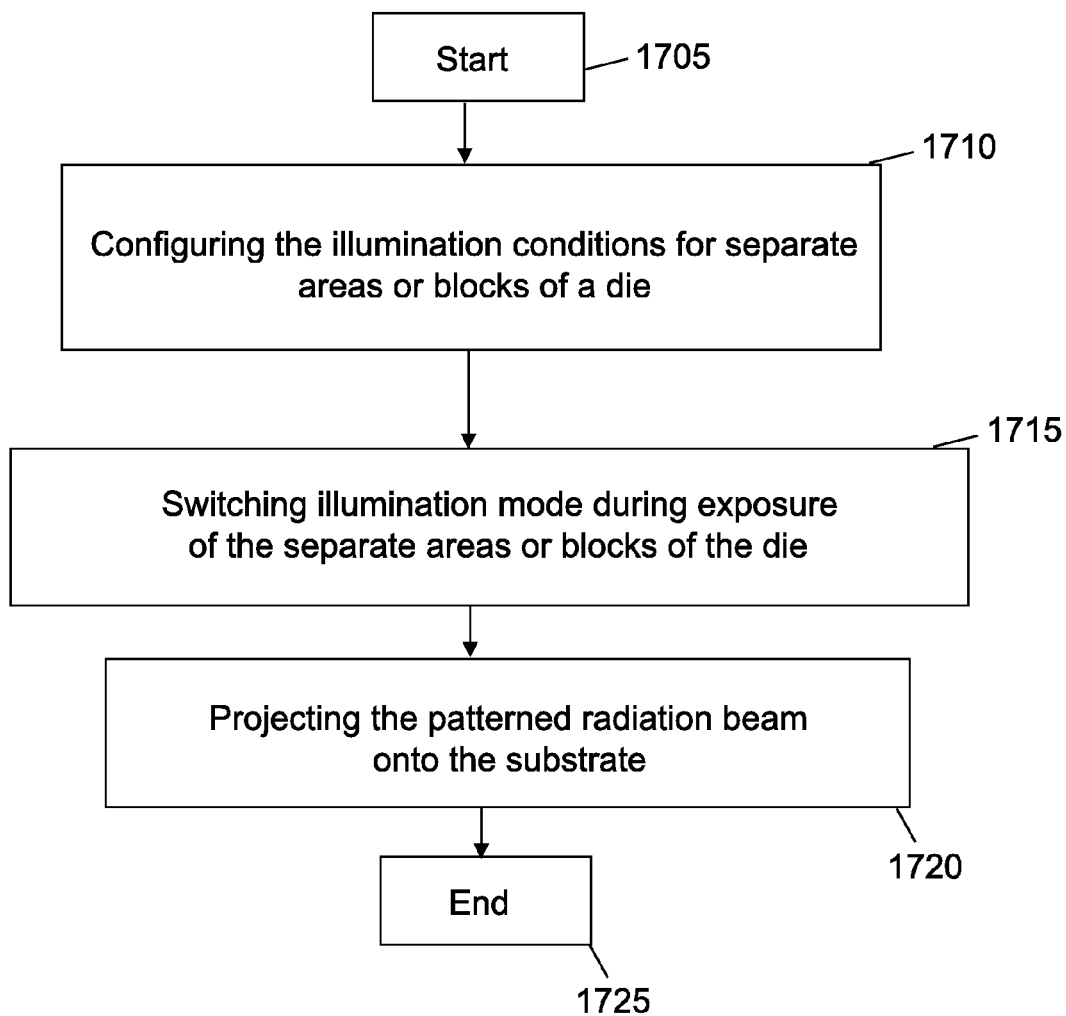
FIG. 17 is a device manufacturing method in accordance with an embodiment of the invention.

In FIG. 17, the method 1700 begins at step 1705 and proceeds to step 1710 where the illumination shapes of various areas or blocks of a circuit are determined/configured. This can be done, as mentioned previously, with lithographic simulations. The method then proceeds to step 1715 where the illumination shapes at the pupil plane 1440 of the illuminator are switched during exposure of the various areas or blocks of the circuit identified in step 1715. At step 1715, the method 1700 involves simultaneously controlling the micro mirror array 1425 and the programmable patterning device 1310. The method then proceeds to step 1720 where the radiation beam patterned by the programmable patterning device 1310 is projected onto the die.

Depending on the type of pattern to be printed, various methods may be used to optimize the patterning device and the source (i.e., the programmable illuminator). For example, in one embodiment of the invention, the source and the patterning device may be simultaneously optimized. This simultaneous optimization may be referred to hereinafter as a source mask optimization. This approach may be preferred to print memory type patterns. An exemplary process for optimizing the printing of a design layout using a source mask optimization in accordance with an embodiment of the invention is shown in FIG. 18.

Figure 23:
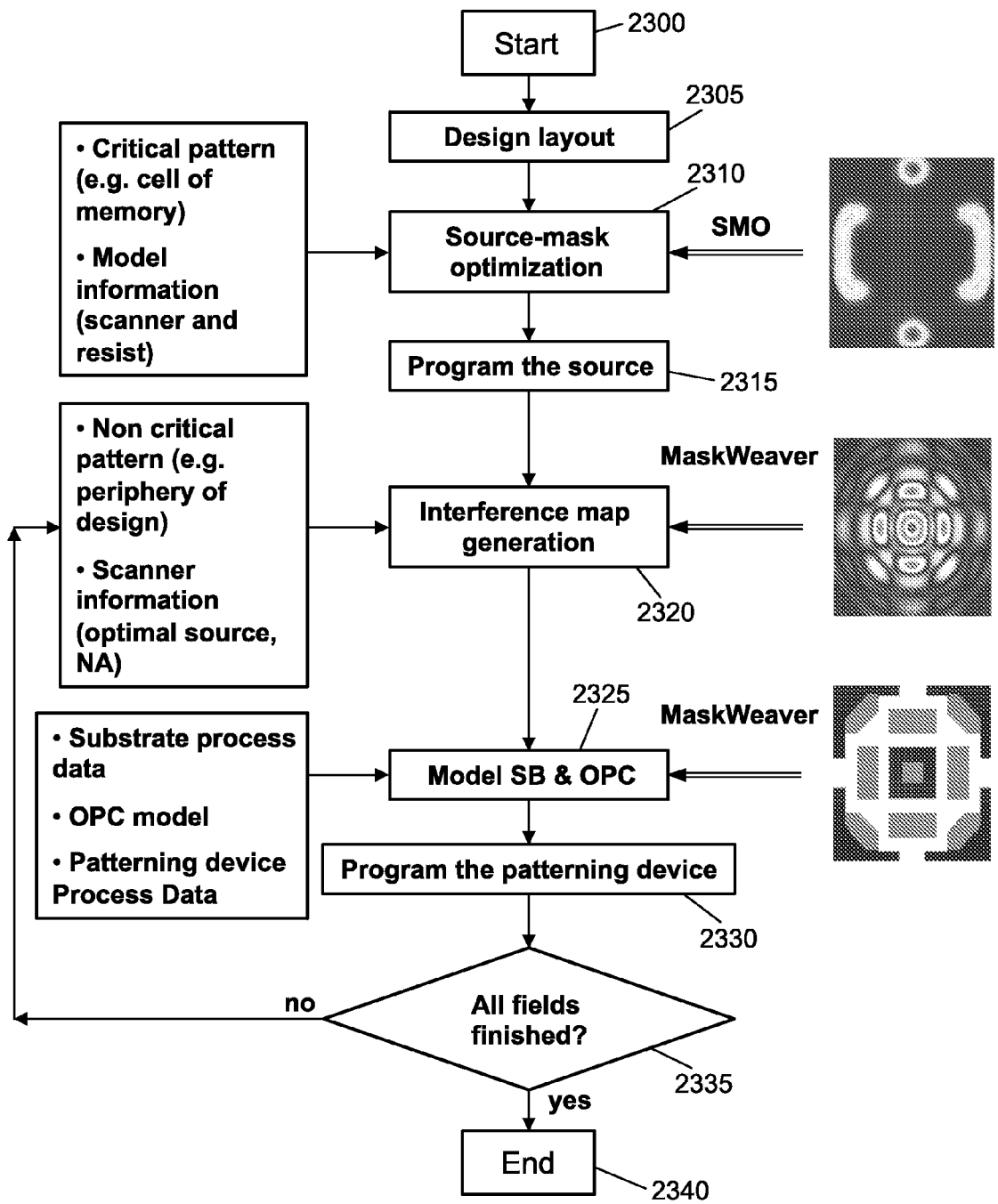
FIG. 23 is an exemplary process for optimizing the printing of a design layout in accordance with an embodiment of the invention.

In an embodiment of the invention, the source (i.e., the programmable illuminator) may be optimized independently of the patterning device. In this embodiment, the source is optimized without modifying the patterning device. After optimizing the source, the patterning device may be optimized with interference mapping lithography and model based optical proximity correction (OPC). This second approach may be preferred to print logic and ASIC type circuits. An exemplary process for optimizing the printing of a design layout using this approach is shown in FIG. 23.

Figure 18:
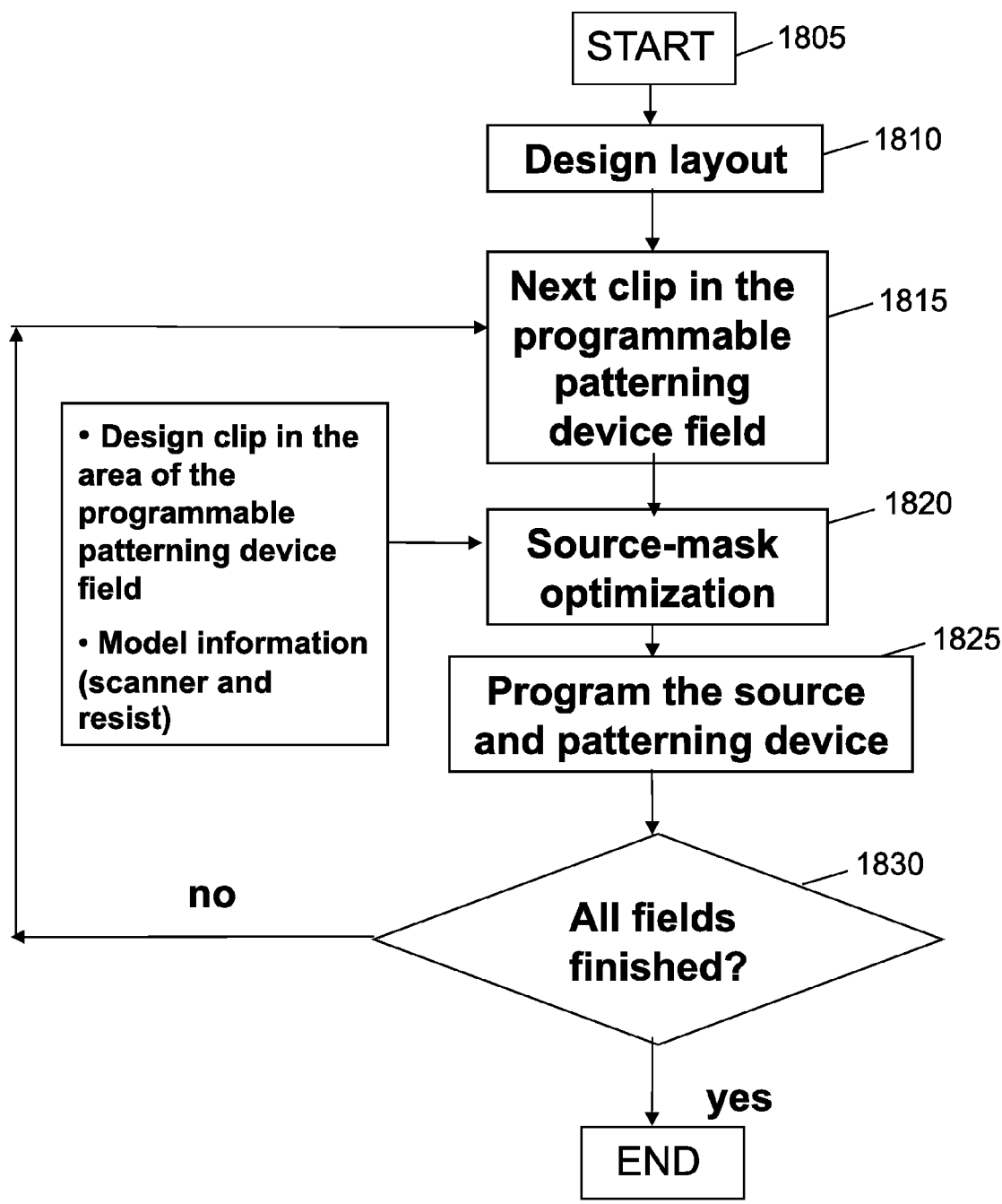
FIG. 18 is an exemplary process for optimizing the printing of a design layout in accordance with an embodiment of the invention.

Referring now to FIG. 18, this figure shows a source mask optimization in accordance with an embodiment of the invention. In the embodiment of FIG. 18, each field of the programmable patterning device 1310 is optimized through a source mask optimization procedure. That is, the programmable illuminator 1305 (via micro mirror array 1425) and the programmable patterning device 1310 are configured or optimized such that each part of the layout of the die is printed with a particular illumination condition and a particular pattern. For example, the programmable illuminator 1305 and the programmable patterning device 1310 are optimized for each field of the programmable patterning device 1310. In so doing, it is possible to obtain a large process latitude for each imaging field.

In FIG. 18, the method begins at step 1805 and proceeds to step 1810 where the user specifies the design layout of the pattern to be printed. The method then proceeds to step 1815 where a first programmable patterning device field is selected. For example, with reference to FIG. 12, the first programmable patterning device field may be used to print a portion of the memory block 1210. After selecting a first patterning device field, the method then proceeds to step 1820 where a source mask optimization procedure is performed for this particular field. The source mask optimization is performed for a selected pattern in the programmable patterning device field. Model information (e.g., scanner and resist) are provided to perform the calculation. Specifically, at step 1820, the programmable illuminator 1305 and the programmable patterning device 1310 are simultaneously optimized for the particular field selected at step 1815.

Optimization of the illumination source or programmable illuminator 1305 involves optimizing the intensity and the shape of the illumination in the pupil plane of the illuminator. Specifically, referring to FIG. 14, the intensity and the illumination shape produced in the pupil plane 1440 is optimized for a particular field of the programmable patterning device 1310. Optimization of the programmable patterning device pattern involves optimizing the magnitude and the phase of the diffraction orders (for example if the programmable patterning device is a matrix-addressable surface having a viscoelastic control layer and a reflective surface or a programmable liquid crystal display (LCD) array) and/or strategic placement of assist features (e.g., by applying bias, serifs, hammerheads and/or scattering bars to the particular field selected at step 1815). Programmable patterning devices such as, for example, a programmable liquid crystal display, are able to create many transmission values, while a fixed patterning device (e.g., a phase shift mask or a CPL mask) can create up to three transmission values. Thus, because more transmission values can be provided with a programmable patterning device, source mask optimization involving both a programmable illuminator and a programmable patterning device may provide a better resolution and process latitude than with a non-programmable device and a conventional illuminator.

Figure 19:
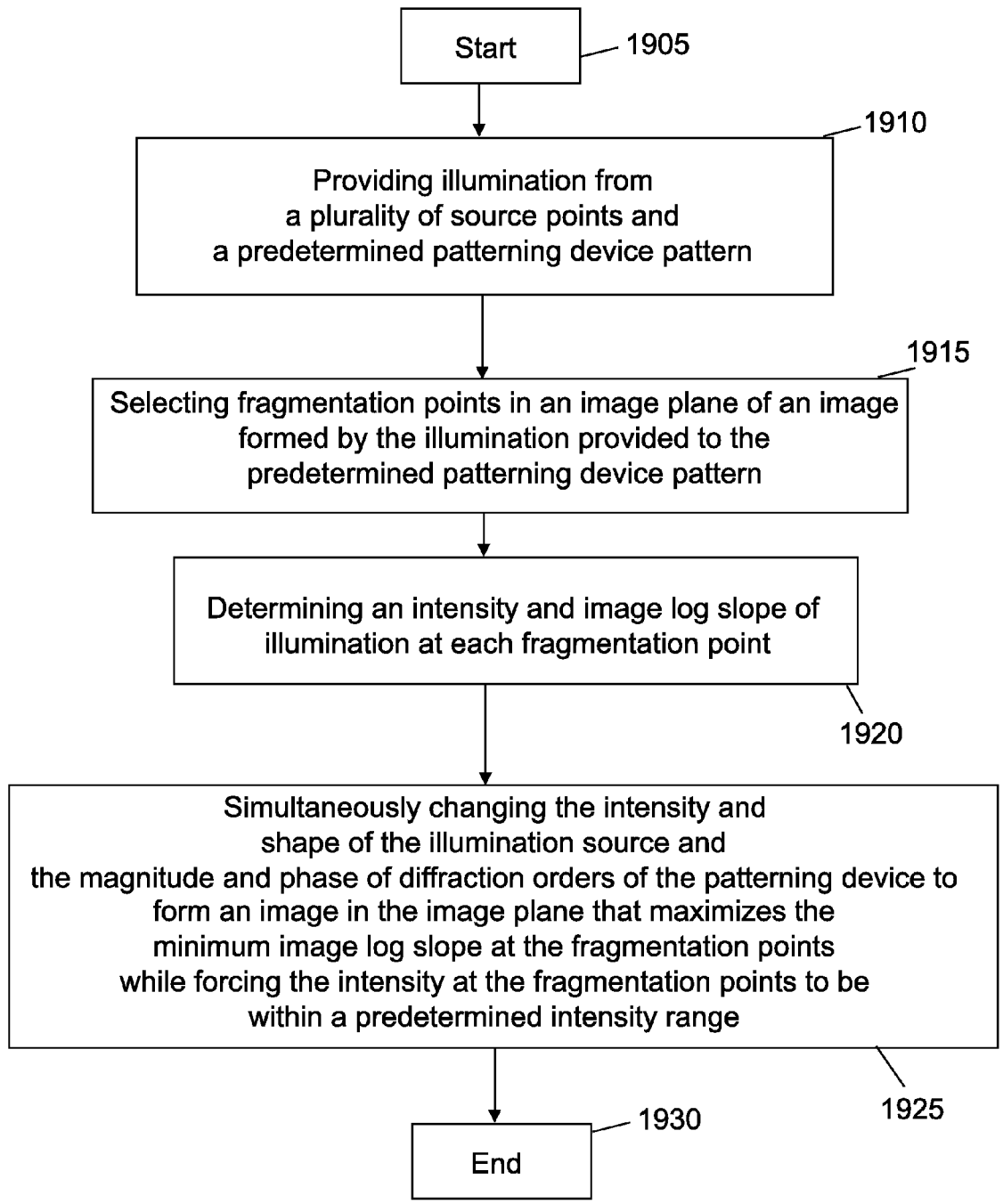
FIG. 19 is an exemplary process of a source mask optimization in accordance with an embodiment of the invention.
Figure 20:
FIG. 20 is a schematic illustration of a patterning device pattern.

In one embodiment of the invention, the source mask optimization (step 1820 of FIG. 18) may be performed in accordance with the method shown in FIG. 19. The method begins at step 1905 and proceeds to step 1910 where, in a lithographic simulation, an illumination from a plurality of source points and a predetermined patterning device pattern is provided. For example, the patterning device pattern may include an array of brickwalls. An example of a brickwall is shown in FIG. 20. The brickwall of FIG. 20 is a typical DRAM pattern.

Figures 21A, 21B:
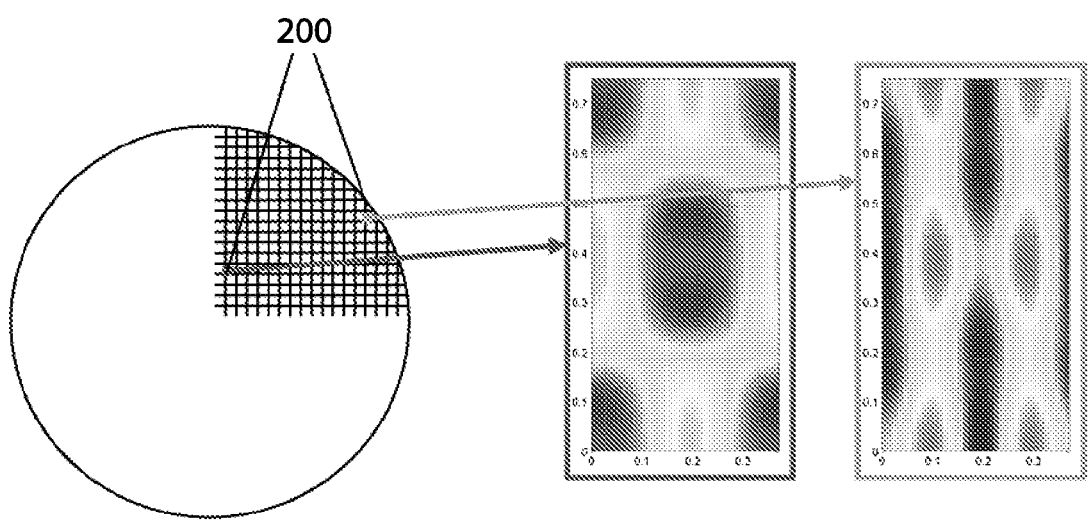
FIGS. 21a-b illustrate an illumination process using Abbe imaging.

FIGS. 21a-b illustrate an illumination process using Abbe imaging. In Abbe's formulation, each source point in the illumination configuration produces a plane wave incident onto the pattern, and each of these source points is imaged onto the substrate. FIGS. 21 a-b show the contribution of two different source points 200 to the image formation of the brickwall pattern shown in FIG. 20. FIG. 21a shows the pupil plane (e.g., 1440) of the illuminator. The source points 200 may be chosen to enhance the normalized image log slope (NILS) on the image plane.

In FIGS. 21 a-b, the aerial image of the brickwall pattern of FIG. 20 is shown for two illumination points. In FIG. 21b, portions of the resulting image are shown from illuminating the brickwall pattern on a patterning device of a 190 nm pitch with a numerical aperture (NA) at the entrance pupil of the projection optics at 0.8. In FIG. 21b, the light areas represent an image intensity that enhances the NILS while the dark areas represent an image intensity that degrades the NILS. Specifically, as shown in FIGS. 21a-b, a point that is proximate the center of the illuminator produces an inverted image. This inverted image is highly undesirable. Consequently, for this particular pattern and process conditions, source points in the center of the illuminator have a detrimental effect on imaging. By contrast, the point that is located at the outer part of the illuminator produces an aerial image that resembles the brickwall design, i.e., dark areas in the brickwall are dark in the aerial image. Consequently, the point in the outer part of the illuminator is beneficial.

After selecting the patterning device pattern and providing a plurality of illumination source points, the method then proceeds to step 1915 where fragmentation points are selected in an image plane of an image formed by the illumination provided to the pattern. Specifically, the image of the selected pattern is fragmented into a number of fragmented edges and a fragmentation point is assigned to each edge fragment. The fragmentation of an edge depends on the surrounding geometry. For example, if an edge corresponds to the end of a line, more fragmentations points are assigned to the end of line. If there is another geometry proximate the critical feature, more fragmentation points are assigned to the critical feature and to the nearby geometry. Generally, the assignment of the fragmentation points is a complex process that depends on the geometry of the selected pattern and the optical model.

After selecting the fragmentation points for the selected pattern, the method proceeds to step 1920 where an intensity and image log slope of illumination at each fragmentation point are determined.

Then, the method proceeds to step 1925 where the intensity and shape of the illumination and the magnitude and phase of diffraction orders from the patterning device pattern are simultaneously changed to form an image in the image plane that maximizes the minimum image log slope at the fragmentation points while forcing the intensity at the fragmentation points to be within a predetermined intensity range. By changing the magnitude and phase of the diffraction orders to maximize the NILS at the fragmentation points, the transmission values of the programmable patterning device may be optimized. For example, referring to FIGS. 22a-c, these figures show the optimized patterning device transmission values and the associated optimized illumination shape obtained in accordance with the method of FIG. 19.

Figure 22A:
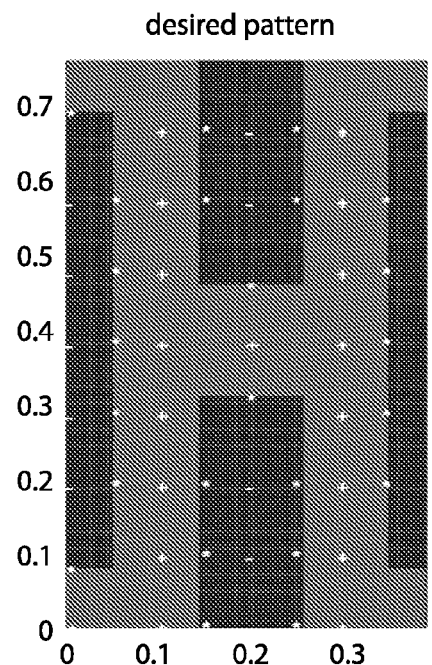
FIGS. 22a-c represent, respectively, the optimized selected pattern, the optimized patterning device transmissions, and the optimized illumination shape obtained in accordance with the method of FIG. 19.

In FIG. 22a the "*" points identify the NILS fragmentation points selected at step 1915, the "+" points identify the points at which intensity should be maximized, and the "−" points identify the points at which intensity should be minimized. The NILS optimization attempts to make the slope of the intensity at the image plane as large as possible to obtain a high contrast in printing the pattern features. The NILS is preferably within a set value which is suitable for the determined NILS fragmentation points along a pattern feature.

In one implementation, the NILS may be tuned such that the exposure latitude is substantially the same for all parts of the exposed pattern. For example, the imaging conditions may be chosen such that the NILS remains substantially the same for all areas of the pattern, even though higher NILS values could be obtained in some areas of the pattern. In this example, the NILS is selected such that it reaches a maximum value for a particular complex area of the pattern. In that way, a better CD uniformity over the total area of the image pattern may be obtained.

Figure 22B:
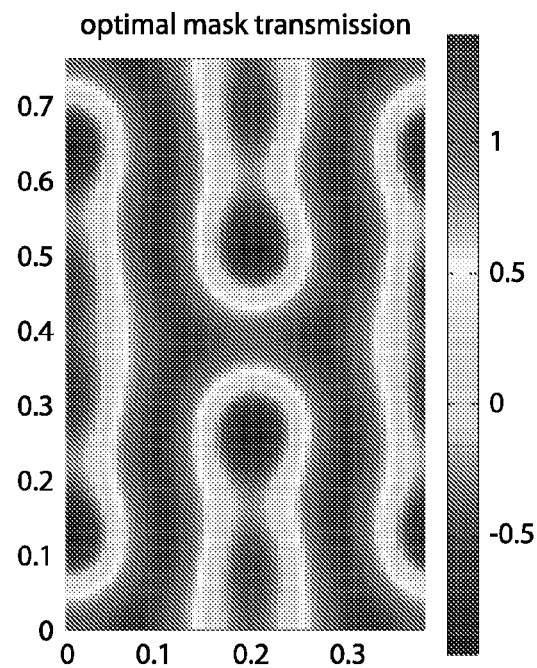
Figure 22C:
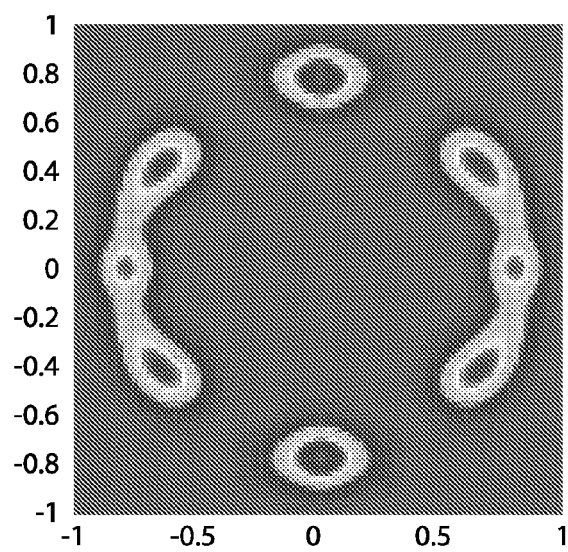

FIG. 22b shows optimum transmission values of the patterning device for the pattern of FIG. 22a that maximize NILS at the fragmentation points. FIG. 22c shows the corresponding optimized illumination source for the selected pattern. Additional information regarding the optimization of the illumination source, the patterning device and a simultaneous optimization of the illumination source and the patterning device may be gleaned from U.S. Patent Application Publication No. 2004/0265707 titled "Source and Mask Optimization", the content of which is incorporated herein in its entirety by reference.

Referring back to FIG. 18, results of the simultaneous optimization of the programmable illuminator (i.e., optimized illumination shape) and the programmable patterning device (e.g., optimized transmission values of the programmable patterning device) for the selected pattern in the first patterning device field are inputted into the programmable illuminator and the programmable patterning device (step 1825). For example, referring to FIGS. 20-22c, in order to optimize the printing of the brickwall shown in FIG. 20, the programmable illuminator and the programmable patterning device are programmed to provide, respectively, the illumination of FIG. 22c and the transmission values of FIG. 22b.

The method then proceeds to step 1830 where a determination is made as to whether all the fields that are needed to print the design layout identified at step 1810 have been optimized. If the result of the inquiry is positive, the process for optimizing the programmable illuminator and the programmable patterning device ends. If the result of the inquiry is negative, the method proceeds to step 1815 where a second patterning device field is selected and the method then proceeds from step 1820 to step 1830 where a source mask optimization procedure is performed for the second patterning device field. This procedure continues until all the fields that are needed to print the design layout have been optimized.

In the embodiment of FIG. 18, it will be appreciated that the illumination shape provided by the programmable illuminator changes as quickly as the patterns provided by the programmable patterning device.

Referring now to FIG. 23, this figure shows a method for optimizing a programmable illuminator and a programmable patterning device in accordance with another embodiment of the invention. In this embodiment, the source is first optimized without optimizing the patterning device. After optimizing the source, the patterning device may be optimized with interference mapping lithography and model based optical proximity correction (OPC). Thus, the optimization of FIG. 23 differs from that of FIG. 18 in that the programmable illuminator is only optimized for a critical pattern of the design layout. The illumination for the critical pattern is then used for the remaining fields of the design layout. After optimizing the programmable illuminator, the programmable patterning device is optimized (e.g., the transmission values) for each field of the design layout.

In FIG. 23, the method begins at step 2305 where the user specifies the design layout to be printed. The method then proceeds to step 2310 where a simultaneous source mask optimization procedure is performed for a critical pattern of the design layout. The source mask optimization at step 2305 may be carried out in the same manner as in FIGS. 18-19. The critical pattern preferably corresponds to the most critical region on the design layout. For example, in one embodiment, the critical pattern may correspond to the brickwall structure shown in FIG. 20. Likewise, at this stage, the model information (e.g., scanner and resist) is provided to determine the optimized illumination shape and patterning device (e.g., transmission values). The method then proceeds to step 2315 where the programmable source (e.g., the programmable illuminator 1305) is programmed with the optimized illumination shape determined at step 2310. This optimized illumination shape is then used to expose the remaining fields of the design layout.

As shown in FIG. 23, after optimizing the programmable illuminator, the method then proceeds from step 2315 to 2320 where the programmable patterning device is optimized for each field through interference mapping lithography (ML). In another embodiment of the invention, the programmable patterning device may be optimized for each field through inverse lithography.

Interference mapping lithography is a technique that optimizes the placement and sizing of assist features on a surface of a substrate in an extremely efficient manner. Using IML, strategic placement and sizing of assist features may be accomplished for enhancing the exposure latitude and the depth of focus. With IML, the optimal transmission value and phase of the patterning device can also be calculated.

IML optimization is performed by first creating an interference map of the design. Specifically, at step 2320, an interference map for a first patterning device field of the design layout is generated. The optimized illumination shape and patterning device transmission values obtained in step 2310 may be used to create the interference map of the first field. Additional information about ML and the formation of interference maps may be gleaned, for example, from U.S. Patent Application Publication No. 2005/0142470 titled "Feature Optimization Using Interference Mapping Lithography," the content of which is incorporated herein by reference in its entirety.

Figure 24A:
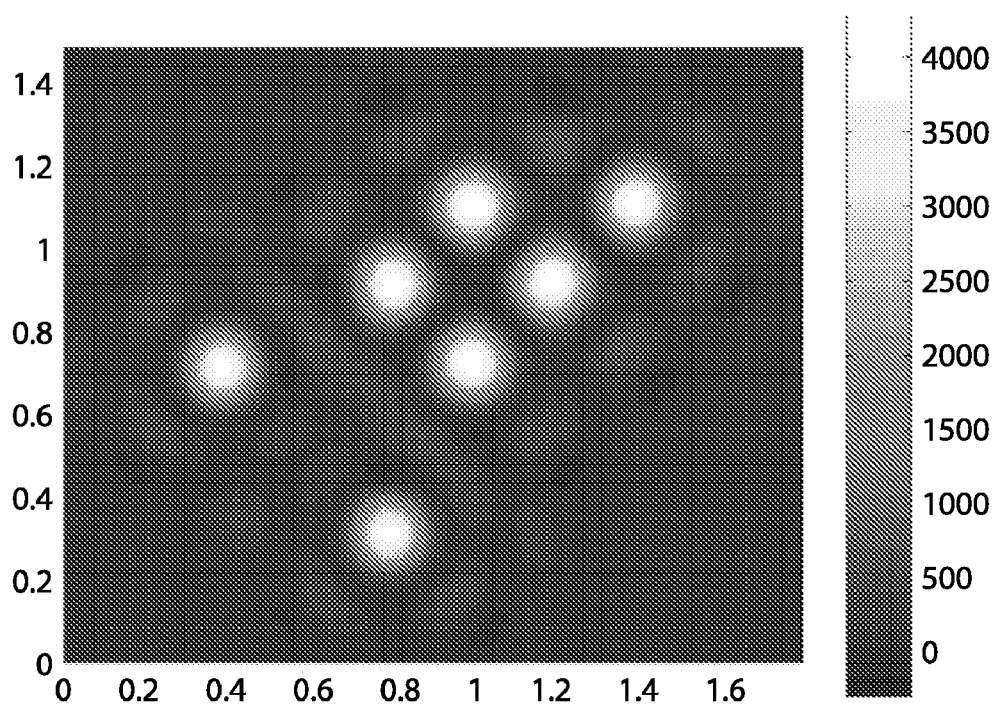
FIG. 24a shows an interference map in accordance with an embodiment of the invention.
Figure 24B:
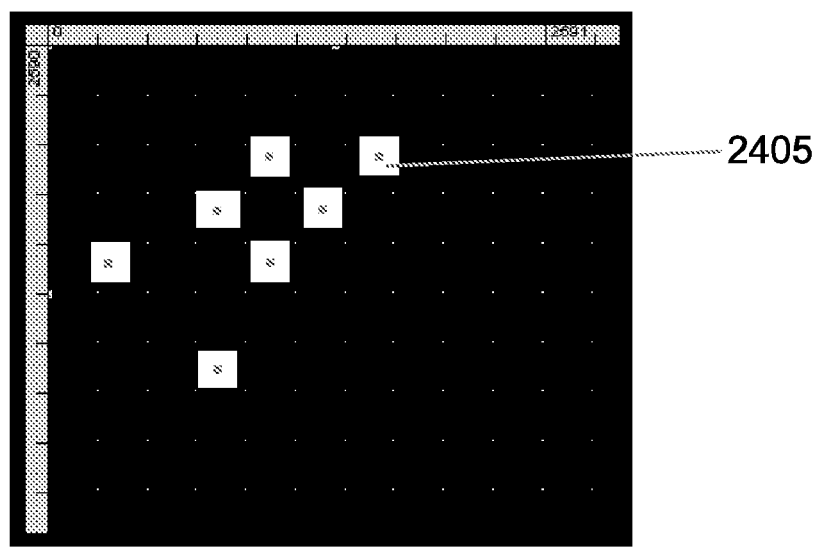
FIG. 24b shows a pattern of contact holes.

Referring to FIG. 24a, this figure shows an interference map obtained for a first field shown in FIG. 24b. The first field includes a pattern of 100 nm contact holes 2405 (minimum pitch of 200 nm). The interference map is calculated for the illumination shape optimized at step 2310. In FIG. 24a, the illumination shape used is an off-axis multipole illumination including four identical poles. Each pole has a normalized inner radius ($\sigma_{in}$=0.5), a normalized outer radius ($\sigma_{out}$=0.8) and a 30° span angle. The radiation wavelength is 193 nm and the numerical aperture of the projection system NA is 0.75.

Referring back to FIG. 23, after generating the interference map, the method then proceeds to step 2325 where optical proximity corrections (OPC) and scattering bars (SB) are determined based on the interference map to optimize the printing process. In the interference map, areas where the magnitude is greater than zero represent locations where the radiation will interfere constructively. By contrast, areas where the magnitude is less than zero represent locations where radiation will interfere destructively. The aerial image of the selected pattern may be improved by placing assist features (OPC and SB) with various transmission values. For example, referring to FIGS. 24a-b, the aerial image of the contact holes 2405 may be improved by placing clear assist features (transmission 100%) where constructive interference occurs in the interference map. The aerial intensity may be improved further by placing 180° phase assist features (transmission of −100%) where destructive interference occurs in the interference map. Patterning device process data, substrate process data and an OPC model are used to select the SBs and OPCs for use in the first field.

Step 2325 involves modifying the interference map representation with OPCs and SBs so as to maximize the intensity corresponding to the resolvable features. Modification of the interference map may include modifying the interference map representation by replacing it with discrete patterning device transmission values such that the representation is maximized relative to the center of the resolvable feature(s) (e.g., the contact holes in FIG. 24b). Next, discrete patterning device transmission values are selected such that the representation is minimized for area(s) outside of the resolvable feature(s). Patterning device transmission values are selected such that intensity side lobes do not print. This optimizes process latitude.

Depth of focus may be maximized as well. A similar approach may be used, but instead the interference map is modified to minimize the change in peak intensity with respect to focus. This is accomplished by taking a partial derivative with respect to focus; and selecting discrete patterning device transmission values that minimize the partial derivative.

The assist features (OPCs and SBs) obtained at step 2325 are then used to program the programmable patterning device (step 2330). Then, a determination is made as to whether all fields of the design layout have been optimized (step 2335). If the result of the inquiry is positive, the source mask optimization process stops (step 2340). If the result of the inquiry is negative, a second illumination field is selected and the method then proceeds from step 2320 to step 2325 where the programmable patterning device (e.g., transmission values and assist features) is optimized for the selected new field. This process continues until all fields of the design layout are optimized.

While much of the description has been in terms of optimization, optimization need not be performed all or part of the time or for all parts of the illumination and/or pattern/patterning device. For example, the source mask optimization may be performed completely or partially "sub-optimally" for expediency, due to imaging requirements, for parts of the patterning device/pattern, etc.

Software functionalities of a computer system involve programming, including executable codes, may be used to implement the above described imaging model. The software code may be executable by a general-purpose computer. In operation, the code and possibly the associated data records may be stored within a general-purpose computer platform. At other times, however, the software may be stored at other locations and/or transported for loading into an appropriate general-purpose computer system. Hence, the embodiments discussed above involve one or more software products in the form of one or more modules of code carried by at least one machine-readable medium. Execution of such codes by a processor of the computer system enables the platform to implement the functions in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as discussed above. Volatile media include dynamic memory, such as main memory of a computer system. Physical transmission media include coaxial cables, copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read or send programming codes and/or data. Many of these forms of computer readable media may be involved in carrying one or more sequences of one or more instructions to a processor for execution.

While specific embodiments of the invention have been described above, it will be appreciated that the invention may be practiced other than as described. The description is not intended to limit the invention.

What is claimed is:

1. A method of transferring an image of a pattern layout onto a surface of a substrate comprising:
   selecting a first illumination profile for a first area of the pattern layout and a second illumination profile for a second area of the pattern layout;
   switching illumination profile during transfer of the image of the pattern layout, the switching including controlling a programmable illuminator including a micro mirror array having a plurality of moveable mirrors that are configured to redirect a beam of radiation, the plurality of moveable mirrors being separately addressable to form the first and second illumination profiles such that the first area of the pattern layout is illuminated with the first illumination profile and the second area is illuminated with the second illumination profile; and
   projecting an image of the illuminated first and second areas onto the surface of the substrate.

2. The method of claim 1, wherein the first and second illumination profiles are selected to optimize printing conditions of the first and second areas on the surface of the substrate.

3. The method of claim 1, wherein selection of the first and second illumination profiles is done by simulation.

4. The method of claim 1, wherein the first and second areas correspond to two different blocks of the pattern layout having different functionalities.

5. The method of claim 4, wherein the pattern layout is a system-on-a-chip.

6. The method of claim 1, wherein the first and second areas are respectively selected from the group consisting of a memory block, a processor block and a input/output block.

7. The method of claim 1, wherein each of the plurality of moveable mirrors is adapted to redirect the beam of radiation onto a pupil plane of the programmable illuminator.

8. The method of claim 7, wherein the controller is configured to control a position of each mirror within the micro mirror array so as to control a position of the beam of radiation in the pupil plane.

9. The method of claim 7, wherein an actuation rate of each mirror is in a range from about 50 Hz to 5 kHz.

10. The method of claim 1, wherein the switching includes controlling a programmable patterning device such that when the programmable patterning device defines a first field of the first area of the pattern layout, the programmable illuminator illuminates the first field with the first illumination mode and when the programmable patterning device defines a second field of the second area of the pattern layout, the programmable illuminator illuminates the second field with the second illumination mode.

11. The method of claim 10, further comprising projecting the first illuminated field and the second illuminated field onto the surface of the substrate.

12. A lithographic apparatus comprising:
   a programmable illuminator configured to provide an illumination profile, the programmable illuminator including a micro mirror array having a plurality of moveable mirrors that are configured to redirect a beam of radiation, the plurality of moveable mirrors being separately addressable to form the illumination profile;
   a support configured to hold a patterning device, the patterning device configured to provide a pattern layout to be illuminated by the illumination profile;
   a substrate table configured to hold a substrate;
   a projection system configured to project an image of the pattern layout onto the substrate; and
   a controller in communication with the programmable illuminator and configured to switch the illumination profile from a first illumination profile to a second illumination profile during transfer of the image of the pattern layout onto the substrate such that a first area of the pattern layout is illuminated with the first illumination profile and a second area of the pattern layout is illuminated with the second illumination profile.

13. The apparatus of claim 12, configured to select the first and second illumination profiles to optimize printing conditions of the first and second areas on the surface of the substrate.

14. The apparatus of claim 13, wherein selection of the first and second illumination profiles is done by simulation.

15. The apparatus of claim 12, wherein the first and second areas correspond to two different blocks of the pattern layout having different functionalities.

16. The apparatus of claim 12, wherein the controller is configured to control a position of each mirror within the micro mirror array so as to control a position of the beam of radiation in the pupil plane.

17. The apparatus of claim 16, wherein an actuation rate of each mirror is in a range from about 50 Hz to 5 kHz.

18. The apparatus of claim 12, wherein the patterning device is a programmable patterning device and wherein the controller is configured to control the programmable patterning device such that when the programmable patterning device defines a first field of the first area of the pattern layout, the programmable illuminator illuminates the first field with the first illumination mode and when the programmable patterning device defines a second field of the second area of the pattern layout, the programmable illuminator illuminates the second field with the second illumination mode.

19. A method for transferring an image of a pattern layout onto a substrate, the pattern layout including a plurality of fields generated by a programmable patterning device, the method comprising:
configuring an illumination profile for each field of the pattern layout, the illumination profile provided by a programmable illuminator, the programmable illuminator including a micro mirror array having a plurality of moveable mirrors that are configured to redirect a beam of radiation, the plurality of moveable mirrors being separately addressable to form the illumination profile;
controlling the programmable illuminator and the programmable patterning device during transfer of the image of the pattern layout onto the substrate such that each field of the pattern layout is illuminated with its associated configured illumination profile; and
projecting an image of each field of the pattern layout onto the substrate to form the image of the pattern layout.

20. The method of claim 19, wherein the configuring further includes optimizing the illumination profile and the patterning device for each field of the pattern layout.

21. The method of claim 19, wherein the configuring further includes optimizing the illumination profile and the patterning device with a source mask optimization procedure.

22. The method of claim 19, wherein the configuring further comprises configuring the programmable patterning device including varying a transmittance by the programmable patterning device.

23. A method for transferring an image of a pattern layout onto a substrate, the pattern layout including a plurality of fields generated by a programmable patterning device, the method comprising:
selecting one of the fields of the pattern layout;
configuring an illumination profile for the selected field of the pattern layout, the illumination profile provided by a programmable illuminator;
configuring the programmable patterning device for each of the fields of the pattern layout using the illumination profile configured for the selected field; and
controlling the programmable illuminator and the programmable patterning device during transfer of the image of the pattern layout onto the substrate such that each field of the pattern layout is generated with its associated patterning device configuration and illuminated with the illumination profile configured for the selected field.

24. The method of claim 23, wherein configuring an illumination profile and the programmable patterning device further includes optimizing the illumination profile and the patterning device for the selected field of the pattern layout.

25. The method of claim 24, wherein configuring an illumination profile and the programmable patterning device further includes optimizing the illumination profile and the patterning with a source mask optimization procedure.

26. The method of claim 23, wherein configuring the programmable patterning device for the selected field includes varying a transmittance by the programmable patterning device.

27. The method of claim 23, further comprising configuring the programmable patterning device using interference mapping lithography and/or inverse lithography.

28. The method of claim 27, wherein configuring the programmable patterning device includes placing assist features within one or more fields of the pattern layout.

29. The method of claim 23, further comprising configuring the programmable patterning device by:
(a) mathematically representing a resolvable feature from one or more of the fields of the pattern layout;
(b) generating an interference map representation from (a)
(c) modifying the interference map representation to maximize intensity corresponding to the one or more resolvable features; and
(d) determining one or more assist feature sizes such that intensity side lobes do not print.

30. The method of claim 23, wherein the selected field is a critical field.

31. The method of claim 23, wherein configuring an illumination profile includes configuring an illumination profile and the programmable patterning device for the selected field of the pattern layout and wherein configuring the programmable patterning device includes configuring the programmable patterning device for each of the remaining fields of the pattern layout using the illumination profile configured for the selected field.

32. A computer product having machine executable instructions, the instructions being executable by a machine to perform a method for transferring an image of a pattern layout onto a substrate, the pattern layout including a plurality of fields generated by a programmable patterning device, the method comprising:
configuring an illumination profile for each field of the pattern layout, the illumination profile provided by a programmable illuminator, the programmable illuminator including a micro mirror array having a plurality of moveable mirrors that are configured to redirect a beam of radiation, the plurality of moveable mirrors being separately addressable to form the illumination profile;
controlling the programmable illuminator and the programmable patterning device during transfer of the image of the pattern layout onto the substrate such that each field of the pattern layout is illuminated with its associated configured illumination profile; and
projecting an image of each field of the pattern layout onto the substrate to form the image of the pattern layout.

33. The product of claim 32, wherein the configuring further includes optimizing the illumination profile and the patterning device for each field of the pattern layout.

34. The product of claim 32, wherein the configuring further includes optimizing the illumination profile and the patterning device with a source mask optimization procedure.

35. The product of claim 32, wherein the configuring further comprises configuring the programmable patterning device including varying a transmittance by the programmable patterning device.

36. A computer product having machine executable instructions, the instructions being executable by a machine to perform a method for transferring an image of a pattern layout onto a substrate, the pattern layout including a plurality of fields generated by a programmable patterning device, the method comprising:

selecting one of the fields of the pattern layout;

configuring an illumination profile for the selected field of the pattern layout, the illumination profile provided by a programmable illuminator;

configuring the programmable patterning device for each of the fields of the pattern layout using the illumination profile configured for the selected field; and controlling the programmable illuminator and the programmable patterning device during transfer of the image of the pattern layout onto the substrate such that each field of the pattern layout is generated with its associated patterning device configuration and illuminated with the illumination profile configured for the selected field.

37. The product of claim 36, wherein configuring an illumination profile and the programmable patterning device further includes optimizing the illumination profile and the patterning device for the selected field of the pattern layout.

38. The product of claim 37, wherein configuring an illumination profile and the programmable patterning device further includes optimizing the illumination profile and the patterning with a source mask optimization procedure.

39. The product of claim 36, wherein configuring the programmable patterning device for the selected field includes varying a transmittance by the programmable patterning device.

40. The product of claim 36, wherein the method further comprises configuring the programmable patterning device using interference mapping lithography and/or inverse lithography.

41. The product of claim 40, wherein configuring the programmable patterning device includes placing assist features within one or more fields of the pattern layout.

42. The product of claim 36, wherein the method further comprises configuring the programmable patterning device by:
  (a) mathematically representing a resolvable feature from one or more of the fields of the pattern layout;
  (b) generating an interference map representation from (a)
  (c) modifying the interference map representation to maximize intensity corresponding to the one or more resolvable features; and
  (d) determining one or more assist feature sizes such that intensity side lobes do not print.

43. The product of claim 36, wherein the selected field is a critical field.

44. The product of claim 36, wherein configuring an illumination profile includes configuring an illumination profile and the programmable patterning device for the selected field of the pattern layout and wherein configuring the programmable patterning device includes configuring the programmable patterning device for each of the remaining fields of the pattern layout using the illumination profile configured for the selected field.

45. A method of imaging a substrate comprising:

transferring an image of a pattern layout onto a surface of a substrate; and switching illumination profile during transfer of the image of the pattern layout onto the surface of the substrate such that a first area of the pattern layout is illuminated with a first illumination profile and a second area of the pattern layout is illuminated with a second illumination profile, the switching including controlling a plurality of moveable mirrors that are configured to redirect a beam of radiation, the plurality of moveable mirrors being separately addressable to form the first and second illumination profiles.

* * * * *

UNITED STATES PATENT AND TRADEMARK OFFICE
CERTIFICATE OF CORRECTION

PATENT NO. : 7,548,302 B2  Page 1 of 1
APPLICATION NO. : 11/655999
DATED : June 16, 2009
INVENTOR(S) : Arno Jan Bleeker et al.

It is certified that error appears in the above-identified patent and that said Letters Patent is hereby corrected as shown below:

On title page, item (75) Inventors
replace "Scotttsdale, AZ"
with --Scottsdale, AZ--.

Signed and Sealed this

Twenty-fifth Day of August, 2009

David J. Kappos
*Director of the United States Patent and Trademark Office*